(12) United States Patent
Lim et al.

(10) Patent No.: US 9,634,071 B2
(45) Date of Patent: Apr. 25, 2017

(54) THIN FILM TRANSISTOR, AND THIN FILM TRANSISTOR ARRAY PANEL AND ORGANIC LIGHT EMITTING DIODE DISPLAY INCLUDING THE SAME

(71) Applicant: Samsung Display Co., Ltd., Yongin (KR)

(72) Inventors: Sea-Hee Lim, Yongin (KR); Sang-Min Hong, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/926,692

(22) Filed: Oct. 29, 2015

(65) Prior Publication Data

US 2016/0049451 A1    Feb. 18, 2016

Related U.S. Application Data

(62) Division of application No. 14/091,517, filed on Nov. 27, 2013, now Pat. No. 9,209,205.

(30) Foreign Application Priority Data

Jul. 12, 2013  (KR) ........................ 10-2013-0082257

(51) Int. Cl.
  *H01L 29/08*   (2006.01)
  *H01L 35/24*   (2006.01)
  (Continued)

(52) U.S. Cl.
  CPC ........ *H01L 27/3248* (2013.01); *H01L 27/124* (2013.01); *H01L 27/1248* (2013.01);
  (Continued)

(58) Field of Classification Search
  USPC .............. 257/40, 59, 72; 349/141, 123, 129; 438/30
  See application file for complete search history.

(56) References Cited

U.S. PATENT DOCUMENTS

2008/0157081 A1*  7/2008  Huh ................... H01L 27/1214
                                                              257/59
2008/0180363 A1*  7/2008  Jeong ................. H01L 27/3244
                                                              345/76
(Continued)

FOREIGN PATENT DOCUMENTS

KR   1020080013163 A    2/2008
KR   1020080056091 A    6/2008
KR   1020080061826 A    7/2008

*Primary Examiner* — Telly Green
(74) *Attorney, Agent, or Firm* — Cantor Colburn LLP

(57) ABSTRACT

A thin film transistor includes a semiconductor which is disposed on a substrate and includes a source region, a drain region and a channel region, a gate insulating layer disposed on the semiconductor, a gate electrode disposed on the gate insulating layer, an interlayer insulating layer disposed on the gate electrode, contact holes defined in the interlayer insulating layer, the contact holes respectively exposing the source region and the drain region of the semiconductor, and a source electrode and a drain electrode which are disposed on the interlayer insulating layer and respectively contact the source region and the drain region through the contact holes, where at least one of the contact holes exposing the source region and the drain region obliquely traverses the semiconductor.

6 Claims, 21 Drawing Sheets

(51) Int. Cl.
*H01L 51/00* (2006.01)
*H01L 27/32* (2006.01)
*H01L 27/12* (2006.01)
*H01L 29/786* (2006.01)

(52) U.S. Cl.
CPC ...... *H01L 27/1288* (2013.01); *H01L 27/3211* (2013.01); *H01L 29/786* (2013.01)

(56) References Cited

U.S. PATENT DOCUMENTS

2013/0187167 A1  7/2013  Jin et al.
2014/0097419 A1  4/2014  Kim et al.
2014/0110678 A1  4/2014  Jin et al.
2014/0117323 A1  5/2014  Ahn

* cited by examiner

THIN FILM TRANSISTOR, AND THIN FILM TRANSISTOR ARRAY PANEL AND ORGANIC LIGHT EMITTING DIODE DISPLAY INCLUDING THE SAME

This application is a divisional of U.S. patent application Ser. No. 14/091,517, filed on Nov. 27, 2013, which claims priority to Korean Patent Application No. 10-2013-0082257 filed on Jul. 12, 2013, and all the benefits accruing therefrom under 35 U.S.C. §119, the entire contents of which are incorporated herein by reference.

BACKGROUND

1. Field

The described technology relates generally to a thin film transistor ("TFT"). More particularly, the described technology relates generally to a TFT array panel including a TFT and an organic light emitting diode ("OLED") display including the same.

2. Description of the Related Art

A thin film transistor ("TFT") array panel is used as a circuit board to independently drive each pixel in a liquid crystal display or an organic light emitting device ("OLED").

The TFT array panel includes a gate line transmitting a gate signal, a data line transmitting a data signal, a TFT connected to the gate line and the data line and a pixel electrode connected to the thin film transistor.

The TFT includes a gate electrode connected to the gate line, a semiconductor layer providing a channel, a source electrode connected to the data line and a drain electrode facing the source electrode with respect to the semiconductor layer. The TFT is a switching element controlling the data signal transmitted to the pixel electrode through the data line according to the gate signal transmitted through the gate line.

The semiconductor layer and a metal layer providing the TFT are electrically connected to each other through contact holes defined in a plurality of insulation layers.

SUMMARY

Contact holes are defined through a photo-process, for example, but a misalignment may be generated when aligning masks for the contact holes.

When the misalignment is generated, underlying semiconductor or metal layers are not exposed through the contact holes such that a contact defect of overlying layers and underlying layers may be generated.

Accordingly, the exemplary embodiment provides a thin film transistor ("TFT"), a TFT array panel, and an organic light emitting diode ("OLED") display including the same in which a contact defect is reduced by increasing a process margin when defining a contact hole.

A TFT according to an exemplary embodiment includes a semiconductor disposed on a substrate and including a source region, a drain region and a channel region, a gate insulating layer disposed on the semiconductor, a gate electrode disposed on the gate insulating layer, an interlayer insulating layer disposed on the gate electrode, contact holes defined in the interlayer insulating layer, the contact holes respectively exposing a source region and a drain region of the semiconductor, and a source electrode and a drain electrode disposed on the interlayer insulating layer and respectively contacting the source region and the drain region through the contact holes, where at least one of the contact holes exposing the source region and the drain region obliquely traverses the semiconductor.

In an exemplary embodiment, the semiconductor may have a pair of semiconductor boundary lines in parallel, and each contact hole may have a pair of contact hole boundary lines intersecting a pair of semiconductor boundary lines and inclined with respect to the semiconductor boundary lines.

In an exemplary embodiment, a middle metal layer overlapping the semiconductor and electrically connected to the semiconductor may be further included.

In an exemplary embodiment, the middle metal layer may be provided to traverse the semiconductor.

In an exemplary embodiment, the middle metal layer may be inclined in a direction opposite to the contact hole to traverse the semiconductor.

A TFT array panel according to another exemplary embodiment includes a substrate, a semiconductor disposed on the substrate and including a source region, a drain region and a channel region, a gate insulating layer disposed on the semiconductor, a gate line disposed on the gate insulating layer and having a gate electrode overlapping the semiconductor, an interlayer insulating layer disposed on the gate line, contact holes defined in the interlayer insulating layer, the contact holes respectively exposing the source region and the drain region of the semiconductor, a data line disposed on the interlayer insulating layer and having a drain electrode and a source electrode respectively contacting the drain region and the source region through the contact holes, a protective layer disposed on the data line, and a first electrode disposed on the protective layer and connected to the drain electrode, where the semiconductor is provided to be obliquely inclined with respect to the data line or the gate line.

In an exemplary embodiment, at least one of the contact holes exposing the source region and drain region may traverse the semiconductor.

In an exemplary embodiment, a middle metal layer overlapping the semiconductor and electrically connected to the semiconductor may be further included.

In an exemplary embodiment, the middle metal layer may be provided to traverse the semiconductor.

In an exemplary embodiment, the middle metal layer may be inclined in a direction opposite to the contact hole to traverse the semiconductor.

In an exemplary embodiment, the first electrode may be electrically connected to the drain electrode through a contact hole defined in the protective layer, and the contact hole defined in the protective layer may be provided to be inclined with respect to the data line or the gate line.

In an exemplary embodiment, an OLED display according to another exemplary embodiment includes a substrate, a gate line disposed on the substrate, a data line and a driving voltage line intersecting the gate line, a switching TFT connected to the gate line and the data line, a driving TFT connected to the drain electrode of the switching thin film transistor, and an OLED connected to the driving thin film transistor, where at least one of the first semiconductor of the driving TFT and the second semiconductor of the switching TFT is provided to be inclined with respect to the gate line or the data line.

In an exemplary embodiment, the first semiconductor and the second semiconductor may respectively include a source region, a drain region and a channel region, the data line may be connected to the source electrode of the switching thin film transistor, the source electrode and drain electrode may be respectively connected to the source region and the drain region through a source contact hole and a drain contact hole, and at least one of the source contact hole and the drain contact hole may traverse the second semiconductor.

In an exemplary embodiment, a first gate insulating layer and a second gate insulating layer disposed on the first semiconductor and the second semiconductor may be further included, and the gate electrode of the driving TFT may be disposed on the second gate insulating layer.

In an exemplary embodiment, the gate electrode of the switching TFT may be disposed on the first gate insulating layer.

In an exemplary embodiment, the middle metal layer may be disposed in and/or on the same layer with the gate electrode of the switching TFT or with the gate electrode of the driving thin film transistor.

In an exemplary embodiment, a middle metal layer electrically connected to the first semiconductor or the second semiconductor and traversing the first semiconductor or the second semiconductor may be further included.

As shown in the exemplary embodiment, when defining the contact hole, the alignment margin of the mask is increased such that the generation of the contact defect may be reduced.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
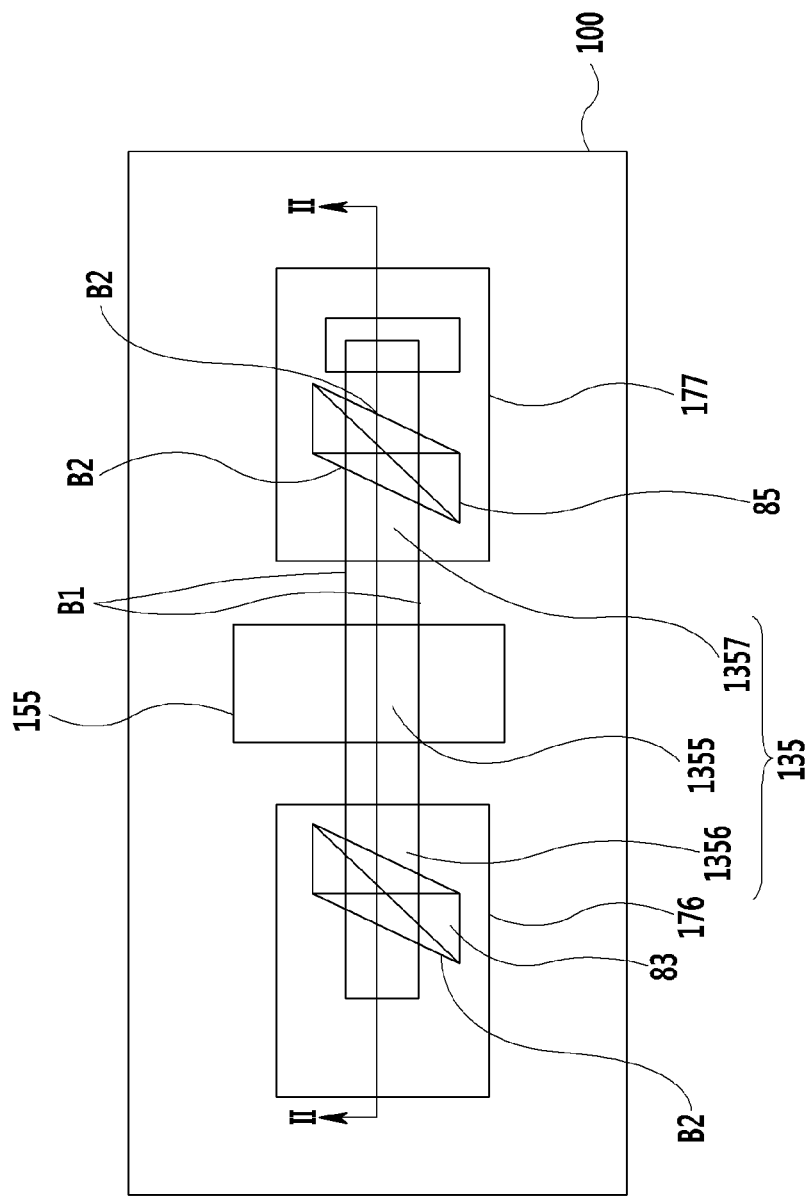
FIG. 1 is a plan view of an exemplary embodiment of a thin film transistor ("TFT") according to the invention.

The exemplary embodiment will be described more fully hereinafter with reference to the accompanying drawings, in which exemplary embodiments are shown. As those skilled in the art would realize, the described exemplary embodiments may be modified in various different ways, all without departing from the spirit or scope of the invention.

In order to clarify the invention, parts that are not connected with the description will be omitted, and the same elements or equivalents are referred to by the same reference numerals throughout the specification.

Furthermore, as the size and thickness of the respective structural components shown in the drawings are arbitrarily illustrated for explanatory convenience, the invention is not necessarily limited to as illustrated.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, "~on" is either positioned on or below a portion of a target or positioned on the upper side based on a gravity direction, throughout the specification.

Further, in the specification, the phrase "on a flat surface" means when an object portion is viewed from above, and the phrase "on a cross-section" means when a cross-section taken by vertically cutting an object portion is viewed from the side.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 2:
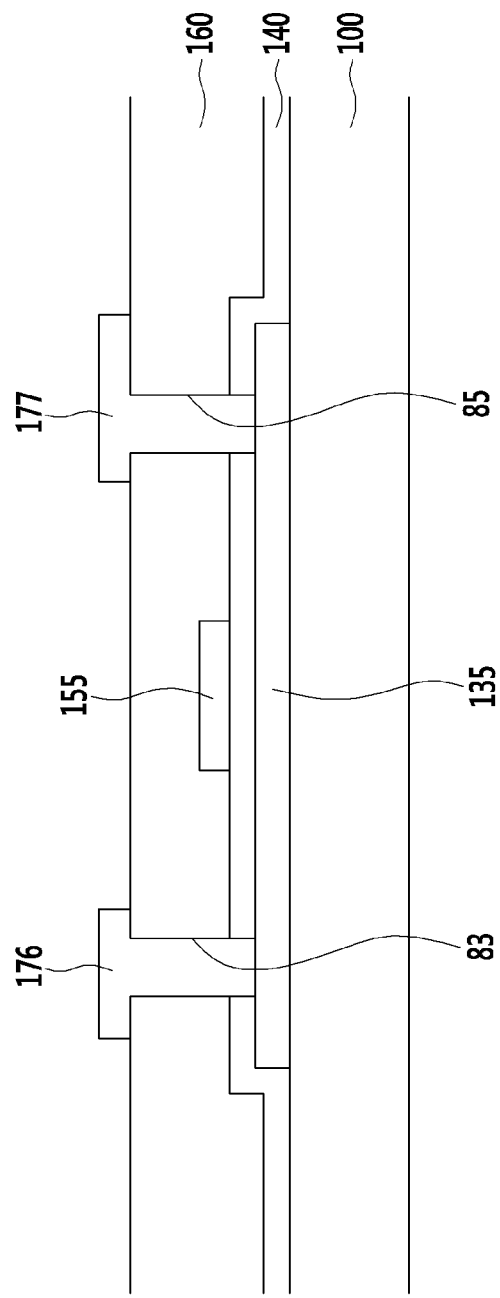
FIG. 2 is a cross-sectional view taken along line II-II of FIG. 1.

FIG. 1 is a plan view of a thin film transistor ("TFT") according to an exemplary embodiment, and FIG. 2 is a cross-sectional view taken along line II-II of FIG. 1.

As shown in FIGS. 1 and 2, a TFT according to an exemplary embodiment includes a semiconductor 135 positioned on a substrate 100, a gate insulating layer 140 positioned on the semiconductor 135, a gate electrode 155 positioned on the gate insulating layer 140, an interlayer insulating layer 160 positioned on the gate electrode 155 and a source electrode 176 and a drain electrode 177 positioned on the interlayer insulating layer 160.

The semiconductor 135 may include polysilicon, microcrystalline silicon, or amorphous silicon. The semiconductor 135 including polysilicon further includes a source region 1356 and a drain region 1357 that are doped with conductive impurities at a high concentration. The conductive impurities doped in the source region 1356 and the drain region 1357 may be one of a p-type impurity and an n-type impurity.

The gate insulating layer 140 may be a single layer or a plurality of layers including at least one of tetraethoxysilane (tetraethyl orthosilicate, "TEOS"), silicon nitride ($SiN_x$) and silicon oxide ($SiO_2$).

The gate electrode 155 may be provided as a single layer or a multilayer of a low resistance material, such as Al, Ti, Mo, Cu, Ni, or an alloy thereof, or a corrosion resistant material.

In an exemplary embodiment, the interlayer insulating layer 160, like the gate insulating layer 140, can include tetraethyl orthosilicate ("TEOS"), silicon nitride ($SiN_x$), or silicon oxide ($SiO_2$).

Contact holes 83 and 85 exposing the source region 1356 and the drain region 1357 of the semiconductor 135 are defined in the interlayer insulating layer 160.

The contact holes 83 and 85 obliquely traverse the semiconductor 135 having two semiconductor boundary lines B1 parallel to each other, and the contact holes 83 and 85 have a contact hole boundary line B2 inclined with respect to the semiconductor boundary line B1. In an exemplary embodiment, a plane shape of the contact holes 83 and 85 is a parallelogram.

The semiconductor 135 may include a protruding portion (not shown) of a rectangular shape or a bar shape such that the contact holes 83 and 85 may easily and obliquely traverse the semiconductor 135. For the contact holes 83 and 85 to obliquely traverse the semiconductor 135, the contact hole boundary line B2 is longer than a distance between the two semiconductor boundary lines B1.

The source electrode 176 and the drain electrode 177 are disposed on the interlayer insulating layer 160. The source electrode 176 and the drain electrode 177 are connected to the source region 1356 and the drain region 1357 through the contact holes 83 and 85, respectively.

As shown in the exemplary embodiment, when defining the contact holes 83 and 85 to obliquely traverse the semiconductor 135, the area of the semiconductor exposed through the contact holes 83 and 85 is increased such that contact resistance of the source electrode 176 and drain electrode 177 and the semiconductor 135 is decreased and an alignment margin of a mask in an exposure process is increased, thereby reducing a contact defect due to a misalignment.

This will be described in detail with reference to FIGS. 3A to 5B.

Figure 3A:
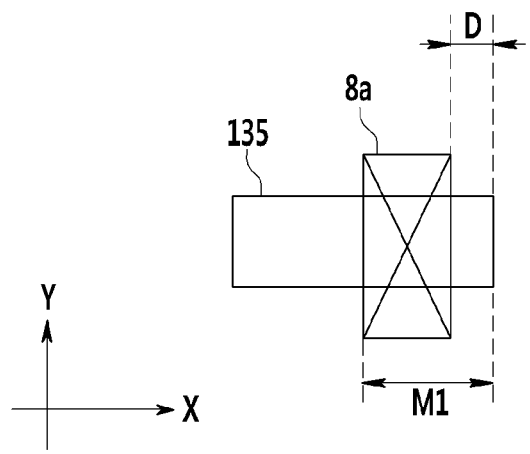
FIGS. 3A, 4A and 5A are top plan views of a semiconductor and a contact hole according to a conventional art.
Figure 3B:
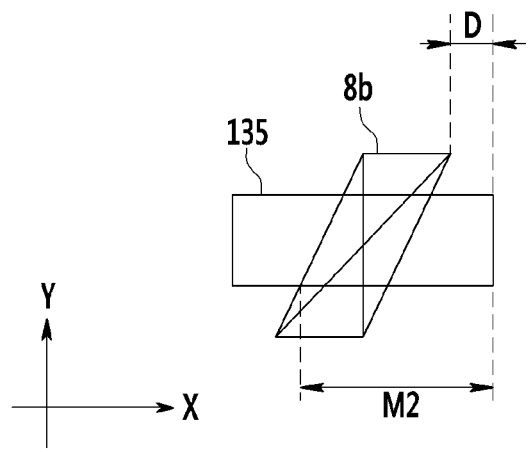
FIGS. 3B, 4B and 5B are top plan views of the exemplary embodiment of a semiconductor and a contact hole according to the invention.
Figure 4A:
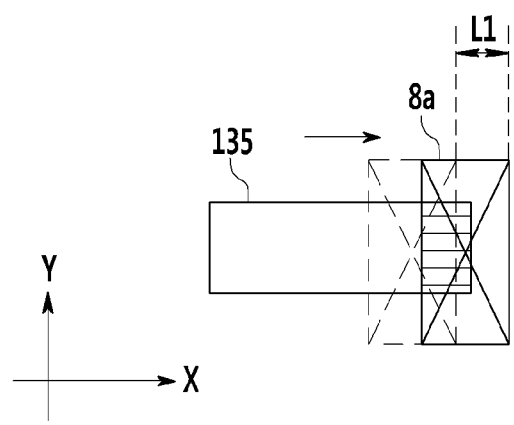
Figure 4B:
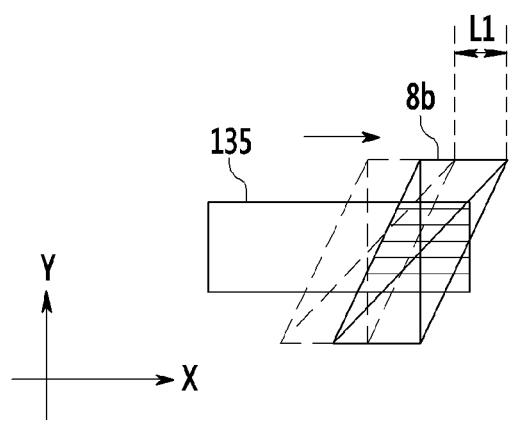
Figure 5A:
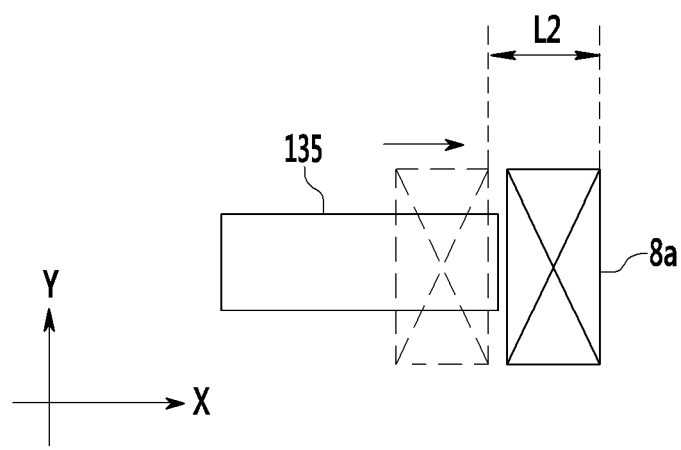
Figure 5B:
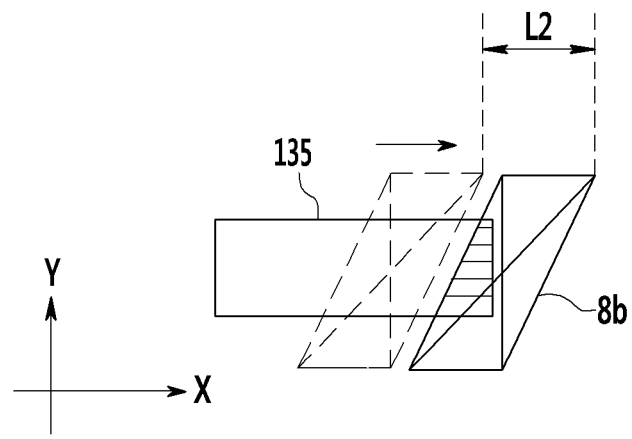

FIGS. 3A, 4A and 5A are top plan views of a semiconductor and a contact hole according to a conventional art, and FIGS. 3B, 4B and 5B are top plan views of a semiconductor and a contact hole according to the exemplary embodiment.

A contact hole according to a conventional art traverses a semiconductor in a vertical direction, but the contact hole according to the exemplary embodiment obliquely traverses the semiconductor.

When the misalignment is not generated, as shown in FIGS. 3A and 3B, contact holes 8a and 8b traverse the semiconductor 135 and are separated from the boundary line of the semiconductor 135 by a first distance D. Here, the semiconductor 135 has a boundary line parallel to a direction (x-axis direction) that the mask is moved to be aligned.

In FIGS. 3A and 3B, the alignment margin of the contact holes 8a and 8b may be within a first alignment margin M1 and a second alignment margin M2 as a sum of the width of the contact holes 8a and 8b and the first distance D. When the misalignment distance of the mask is equal to or larger than the first alignment margin M1 and the second alignment margin M2, the contact holes 8a and 8b deviate from the semiconductor 135.

As shown in FIGS. 4A and 4B, when the misalignment of the mask is generated by the first moving distance L1 in the x-axis direction as the direction that the mask is moved for the alignment, the contact holes 8a and 8b partially deviate from the semiconductor 135. Accordingly, when the misalignment is generated by the distance L1, the area of the semiconductor 135 exposed through the contact holes 8a and 8b in FIGS. 4A and 4B is smaller than the area of the semiconductor exposed through the contact holes 8a and 8b in FIGS. 3A and 3B such that the contact resistance is increased. However, in the exemplary embodiment of FIG. 4B, when the contact hole 8b is defined to obliquely traverse the semiconductor 135, the exposure area of the semiconductor 135 is larger than when defining the contact hole 8a according to the conventional art of FIG. 4A. Accordingly, although the misalignment is generated, when defining the contact hole according to FIG. 4B, the contact resistance is less increased than when defining the contact hole according to FIG. 4A.

Also, as shown in FIGS. 5A and 5B, when the mask is moved by the second moving distance L2 outside the alignment margins M1 and M2, the contact hole 8a of FIG. 5A is completely deviated from the semiconductor 135. In contrast, although a portion of the contact hole 8b of FIG. 5B according to the exemplary embodiment is positioned to be deviated from the semiconductor 135, a portion of the contact hole 8b exposes the semiconductor 135.

In the exemplary embodiment, when the semiconductor 135 is provided to have the boundary line parallel to the direction that the mask is moved to be aligned and the contact hole 8b is defined to have the boundary line that is inclined with respect to the boundary line of the semiconductor 135, the area of the semiconductor 135 exposed through the contact hole 8b is increased such that the misalignment margin is increased. Accordingly, the generation of the contact defect due to the misalignment may be reduced.

The semiconductor and the contact hole are positioned to be oblique with respect to the moving direction of the make to align the mask.

This will be described with reference to FIGS. 6A to 8B.

Figure 6A:
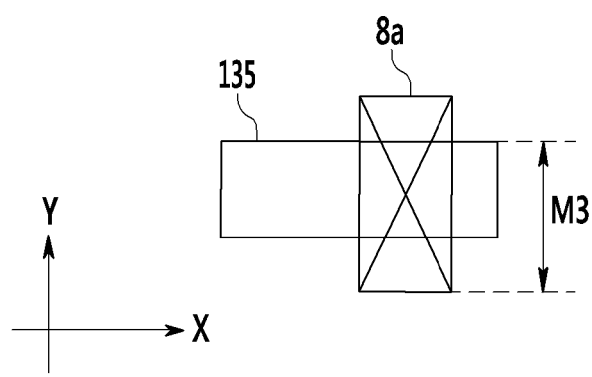
FIGS. 6A, 7A and 8A are top plan views of a semiconductor and a contact hole according to a conventional art.
Figure 6B:
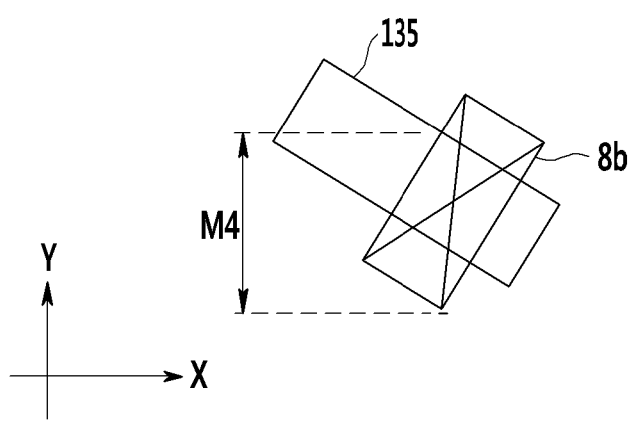
FIGS. 6B, 7B and 8B are top plan views of the exemplary embodiment of a semiconductor and a contact hole according to the invention.
Figure 7A:
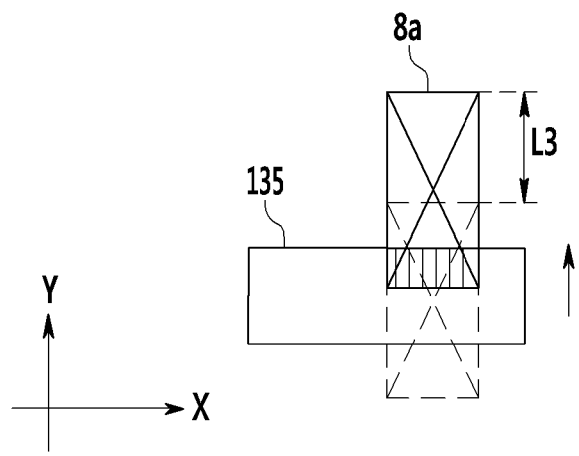
Figure 7B:
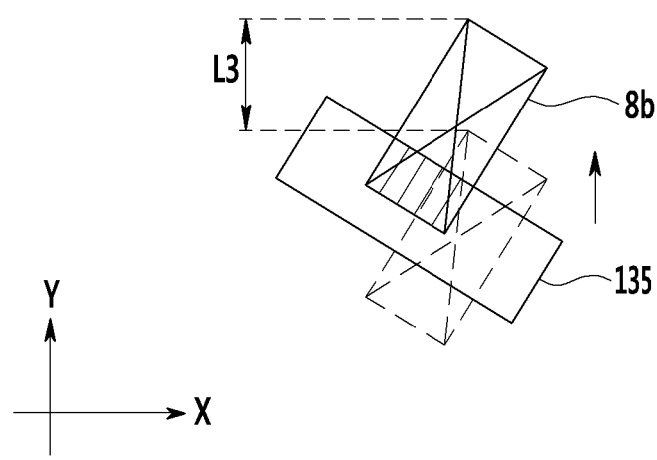
Figure 8A:
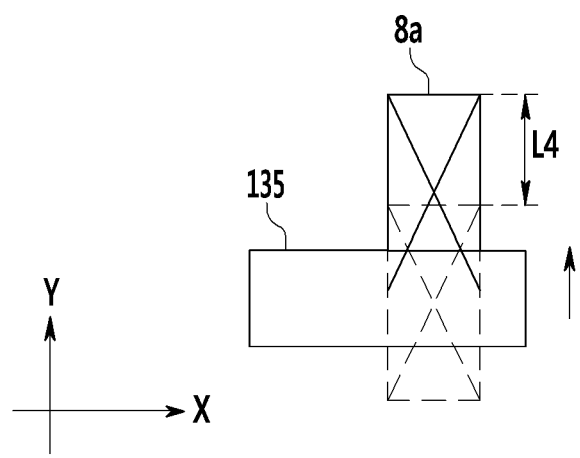
Figure 8B:
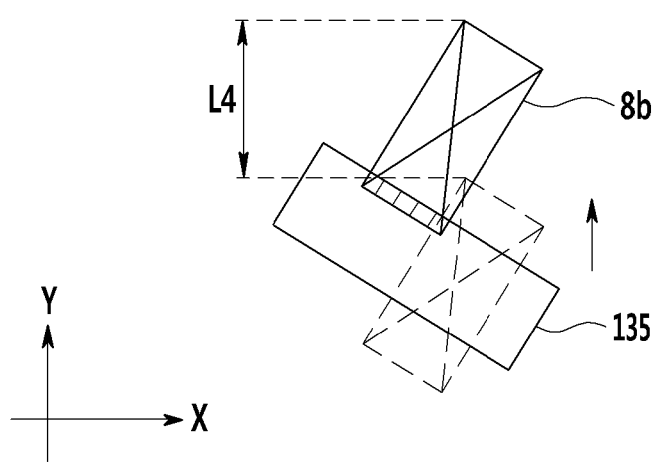

FIGS. 6A, 7A and 8A are top plan views of a semiconductor and a contact hole according to a conventional art, and FIGS. 6B, 7B and 8B are top plan views of a semiconductor and a contact hole according to the exemplary embodiment.

The semiconductor 135 according to the conventional art is parallel to the x-axis and the contact hole 8a vertically traverses the semiconductor, but the contact hole 8b according to the exemplary embodiment traverses the semiconductor 135 while both of the semiconductor and the contact hole 8b are inclined with respect to the y-axis.

Here, the mask is moved in the x-axis and y-axis directions for the alignment, and moving the mask in the y-axis direction will be described hereafter.

When the misalignment is not generated, as shown in FIGS. 6A and 6B, the contact holes 8a and 8b traverse the semiconductor 135, and two traversing boundary lines of the contact holes 8a and 8b are positioned on the semiconductor. The alignment margin of the contact holes 8a and 8b includes a third alignment margin M3 and a fourth alignment margin M4 as a sum of a length of the y-axis of a region where the semiconductor 135 and the contact hole 8a or 8b overlap and a length of the y-axis of the contact hole that is deviated from the semiconductor.

As shown in FIGS. 7A and 7B, for the alignment, when the mask is moved by the third moving distance L3 in the y-axis direction such that the misalignment of the mask is generated, the contact holes 8a and 8b are partially deviated from the semiconductor 135. when the misalignment is generated by the third moving distance L3, the area of the semiconductor 135 exposed through the contact holes 8a and 8b in FIGS. 6A and 6B is decreased compared to the area of the semiconductor exposed through the contact holes in FIGS. 7A and 7B such that the contact resistance is increased. However, in the exemplary embodiment of FIG. 7B, when the contact hole 8b is defined, the exposure area of the semiconductor 135 is larger than when defining the contact hole 8a according to the conventional art of FIG. 7A. Accordingly, although the misalignment is generated, when defining the contact hole according to FIG. 7B rather than FIG. 7A, the contact resistance is less increased.

Further, as shown in FIGS. 8A and 8B, when the mask is moved by the third moving distance L4 over the alignment margins M3 and M4, the contact hole 8a of FIG. 8A is completely deviated from the semiconductor 135, however the contact hole 8b of FIG. 8B according to the exemplary embodiment is partially deviated from the semiconductor 135 and a portion of the contact hole 8b exposes the semiconductor 135.

In the exemplary embodiment, to align the mask, when the semiconductor 135 and the contact hole 8b are defined to be oblique with respect to the direction that the mask is moved, the area of the semiconductor 135 exposed through the contact hole 8b is increased such that the misalignment margin is increased. Accordingly, the generation of the contact defect due to the misalignment may be reduced.

Figure 9:
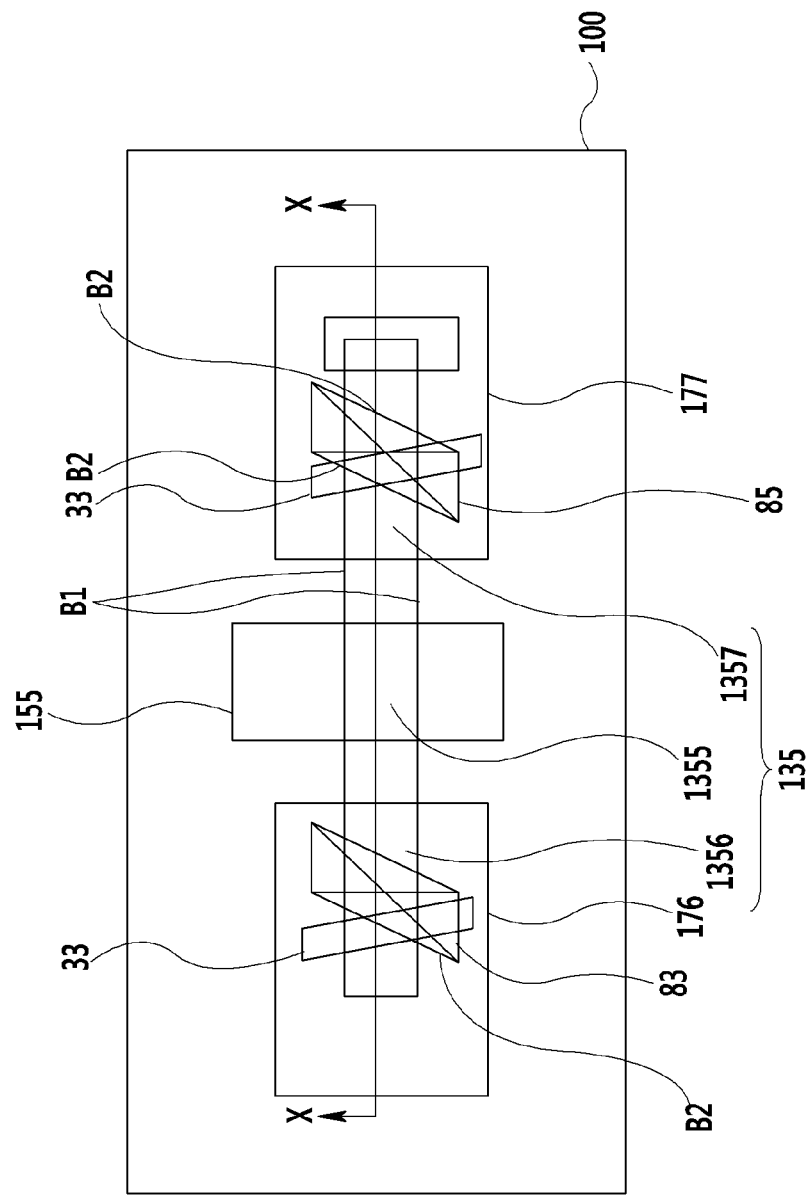
FIG. 9 is a top plan view of another exemplary embodiment of a TFT according to the invention.
Figure 10:
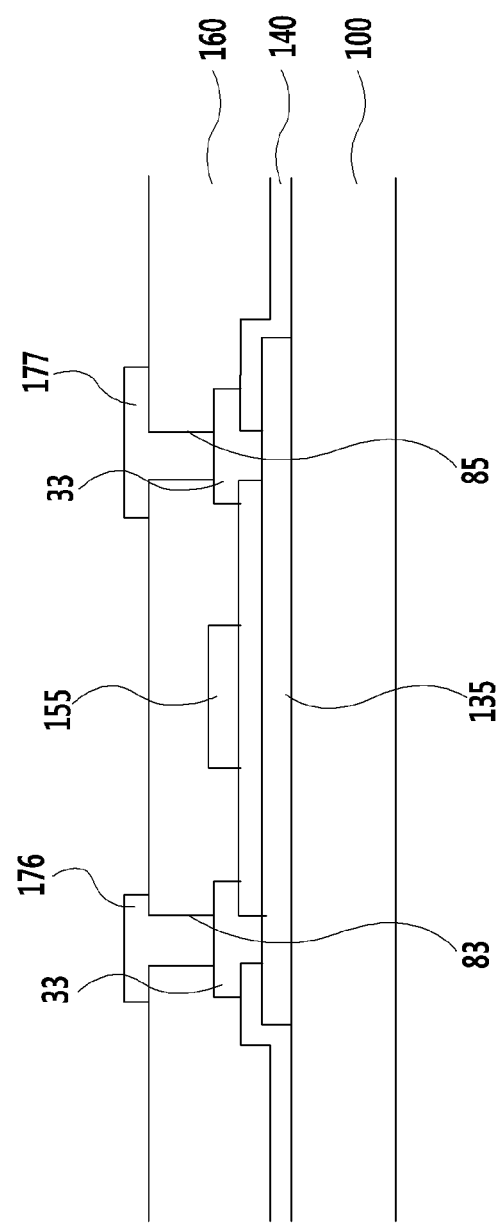
FIG. 10 is a cross-sectional view taken along line X-X of FIG. 9.

FIG. 9 is a top plan view of a TFT according to another exemplary embodiment, and FIG. 10 is a cross-sectional view taken along line X-X of FIG. 9.

The TFT of FIGS. 9 and 10 is substantially same as the TFT of FIGS. 1 and 2 in the most part such that differences will be described in detail.

The TFT of FIGS. 9 and 10 includes the semiconductor 135 positioned on the substrate 100, the gate insulating layer 140 positioned on the semiconductor 135, the gate electrode 155 positioned on the gate insulating layer 140, the interlayer insulating layer 160 positioned on the gate electrode 155 and the source electrode 176 and the drain electrode 177 positioned on the interlayer insulating layer 160 and connected to the source region 1356 and the drain region 1357 through the contact holes 83 and 85, respectively.

A middle metal layer 33 positioned between the source region 1356 or the drain region 1357 and the source electrode 176 or the drain electrode 176 is further included. The middle metal layer 33 obliquely traverses the semiconductor 135 in the opposite direction to the contact hole 85.

In FIG. 10, the middle metal layer 33 and the semiconductor 135 are connected through the contact hole via the contact hole interposed therebetween. However, in another exemplary embodiment, the middle metal layer 33 may be directly disposed on the semiconductor.

In the exemplary embodiment, when providing the middle metal layer 33, the misalignment margin may be further increased.

This will be described in detail with reference to FIGS. 11A to 14B.

FIGS. 11A, 12A, 13A and 14A are top plan views of a semiconductor and a contact hole according to a conventional art, and FIGS. 11B, 12B, 13B and 14B are top plan views of a semiconductor and a contact hole according to the exemplary embodiment.

Referring to FIGS. 11A, 12A, 13A and 14A in which the misalignment is not generated, the semiconductor 135 overlaps the middle metal layer 33 and the contact hole 8. The semiconductor 135 is in contact with or is electrically connected to the middle metal layer 33 through a contact hole (not shown), and the contact hole 8 exposes the middle metal layer 33.

Although the misalignment is generated in the x-axis direction or the y-axis direction, the middle metal layer 33 overlaps the contact hole such that the overlaying metal such as the source electrode or the drain electrode is in contact with the middle metal layer 33 through the contact hole 8 to be electrically connected to the semiconductor 135.

Figure 11A:
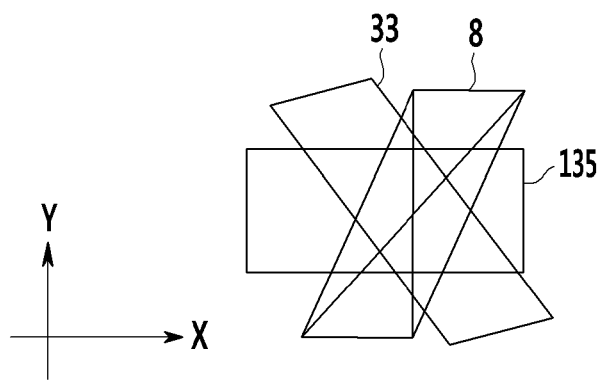
FIGS. 11A, 12A, 13A and 14A are top plan views of a semiconductor and a contact hole according to a conventional art.
Figure 11B:
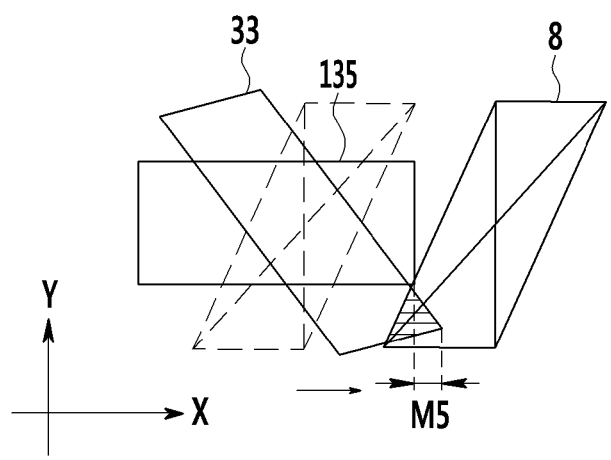
FIGS. 11B, 12B, 13B and 14B are top plan views of the exemplary embodiment of a semiconductor and a contact hole according to the invention.
Figure 12A:
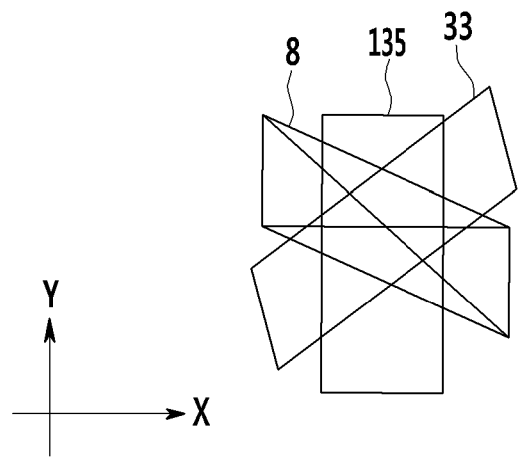
Figure 12B:
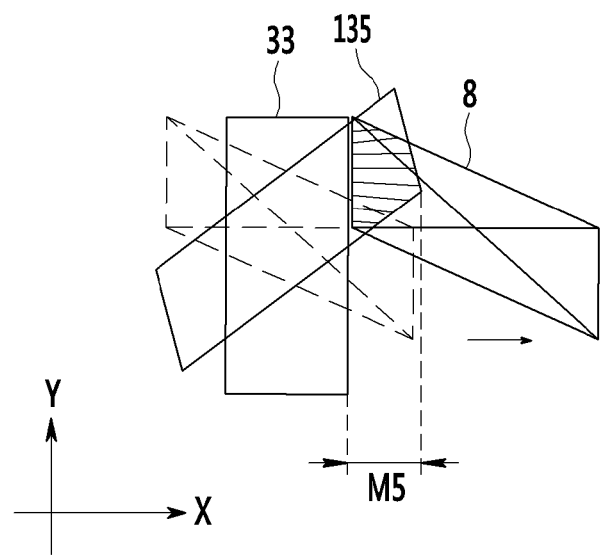
Figure 13A:
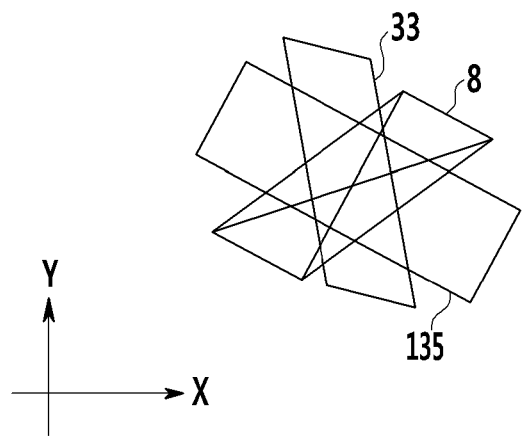
Figure 13B:
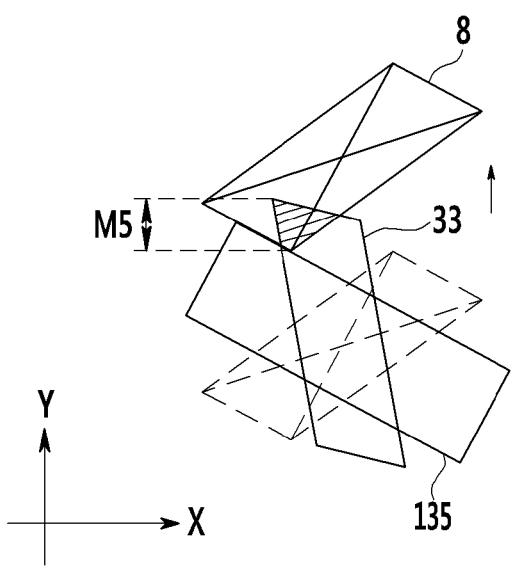
Figure 14A:
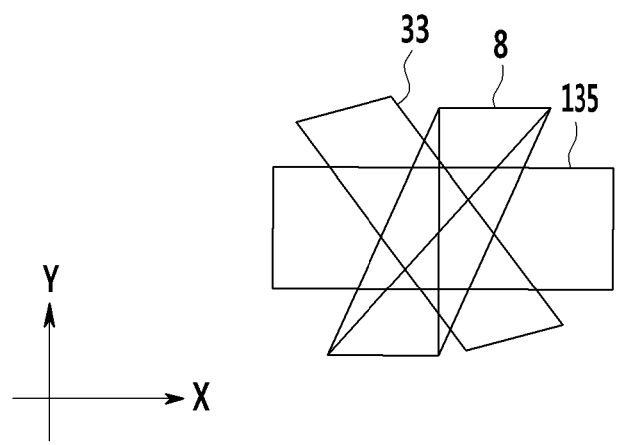
Figure 14B:
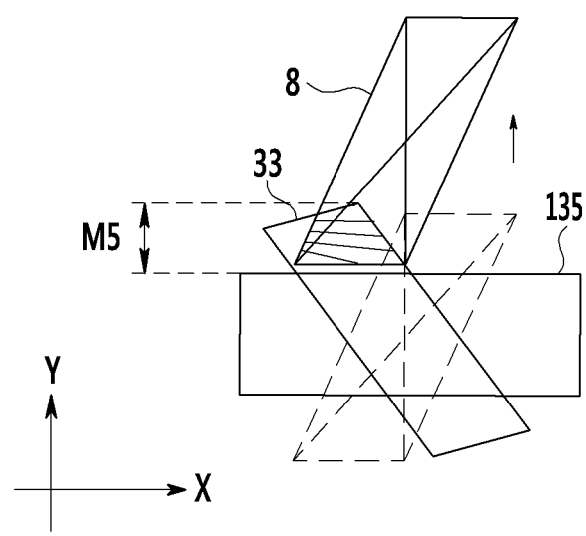

In FIGS. 11B and 12B, although the contact hole 8 is moved in the x-axis direction such that the misalignment is generated, similar to an exemplary embodiment in which the contact hole 8 moved in the y-axis direction as shown in FIGS. 13B and 14B, although the misalignment of the contact hole 8 is generated in the x-axis or the y-axis such that the contact hole 8 is deviated from the boundary line of the semiconductor 135, the contact hole 8 partially overlaps the middle metal layer 33.

This is because the middle metal layer 33 and the semiconductor 135 are in contact and are electrically connected such that the misalignment margin is increased by the area of the middle metal layer 33. Particularly, an alignment margin M5 having an increased area of the middle metal layer 33 positioned in the direction that the mask is moved for the alignment, that is, in the x-axis direction and/or the y-axis direction, is obtained.

That is, the alignment margin M5 may be a distance from a position where the boundary line of the contact hole 8 positioned in the moving direction and the boundary line of the semiconductor 135 meet each other to the outermost boundary line in the x-axis direction in the middle metal layer 33 when the mask is moved in the moving direction for the alignment, for example, as shown in FIGS. 11B and 12B, in the x-axis direction.

This is the same as the case that the mask is moved in the y-axis direction as shown in FIGS. 13B and 14B. That is, the alignment margin M5 may be a distance from the position that the boundary line of the contact hole 8 positioned at the Y-axis where the mask is moved and the boundary line of the semiconductor 135 to an outermost boundary line in the y-axis direction at the middle metal layer 33.

In the above exemplary embodiment, the contact hole to connect the semiconductor and the source electrode or the drain electrode was described, but a contact hole to connect the metal layer and the metal layer may be equally applied.

The above TFT may be used as a TFT of an organic light emitting diode ("OLED") display. Hereafter, the OLED display including the TFT of FIGS. 1 and 2 will be described.

Figure 15:
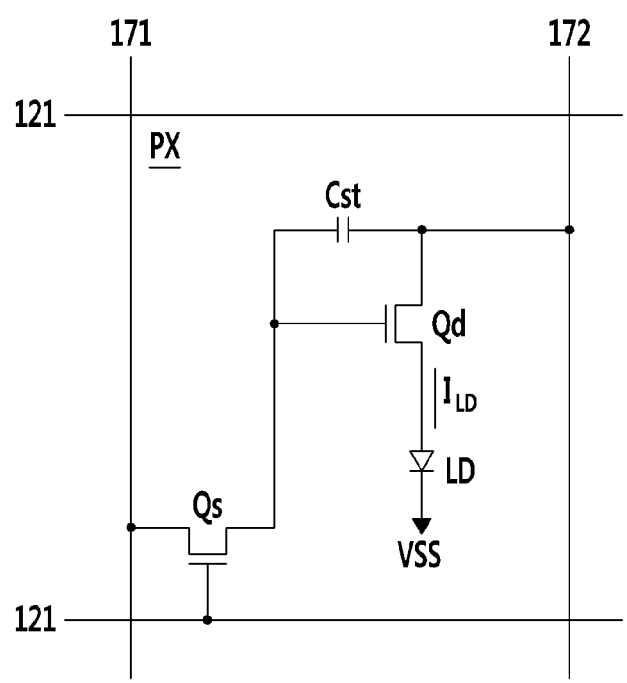
FIG. 15 shows the exemplary embodiment of an equivalent circuit of one pixel of an organic light emitting diode ("OLED") display according to the invention.

FIG. 15 is an equivalent circuit of one pixel of an OLED display according to an exemplary embodiment.

As shown in FIG. 15, the OLED display according to the exemplary embodiment includes a plurality of signal lines 121, 171 and 172 and a pixel PX connected thereto.

The signal lines include a scan signal line (or gate line) 121 transferring a gate signal (or a scan signal), a data line 171 transferring a data signal, a driving voltage line 172 transferring a driving voltage, and the like. The gate lines 121 extends substantially in a row direction and are substantially parallel to each other, and the data lines 171 extends substantially in a column direction and are substantially parallel to each other. Although the driving voltage lines 172 are shown as extending substantially in a column direction, the driving voltage lines 172 may extend in a row direction or in a column direction, or may be provided in a matrix.

Each pixel PX includes a switching transistor Qs, a driving transistor Qd, a storage capacitor Cst and an organic light emitting element LD.

The switching transistor Qs includes a control terminal, an input terminal and an output terminal, in which the control terminal is connected to the gate line 121, the input terminal is connected to the data line 171, and the output terminal is connected to the driving transistor Qd. The switching transistor Qs transmits the data signal received from the data line 171 to the driving transistor Qd in response to the scanning signal received from the gate line 121.

The driving transistor Qd also includes a control terminal, an input terminal and an output terminal, in which the control terminal is connected to the switching transistor Qs, the input terminal is connected to the driving voltage line 172, and the output terminal is connected to the organic light emitting element LD. The driving transistor Qd applies an output current ILD, of which the magnitude varies according to the voltage applied between the control terminal and the output terminal of the driving transistor Qd.

The capacitor Cst is connected between the control terminal and the input terminal of the driving transistor Qd. The capacitor Cst stores the data signal applied to the control terminal of the driving transistor Qd and maintains the stored data signal even after the switching transistor Qs is turned off.

The organic light emitting element LD is an OLED, for example, having an anode connected to the output terminal of the driving transistor Qd and a cathode connected to a common voltage VSS. The OLED LD emits light of which the intensity is varied according to the output current ILD of the driving transistor Qd, thereby an image is displayed. In an exemplary embodiment, the OLED LD may include an organic material intrinsically emitting any one or at least one light of primary colors such as three primary colors of red, green and blue, and the OLED display displays a desired image by a spatial sum of the colors.

Figure 16:
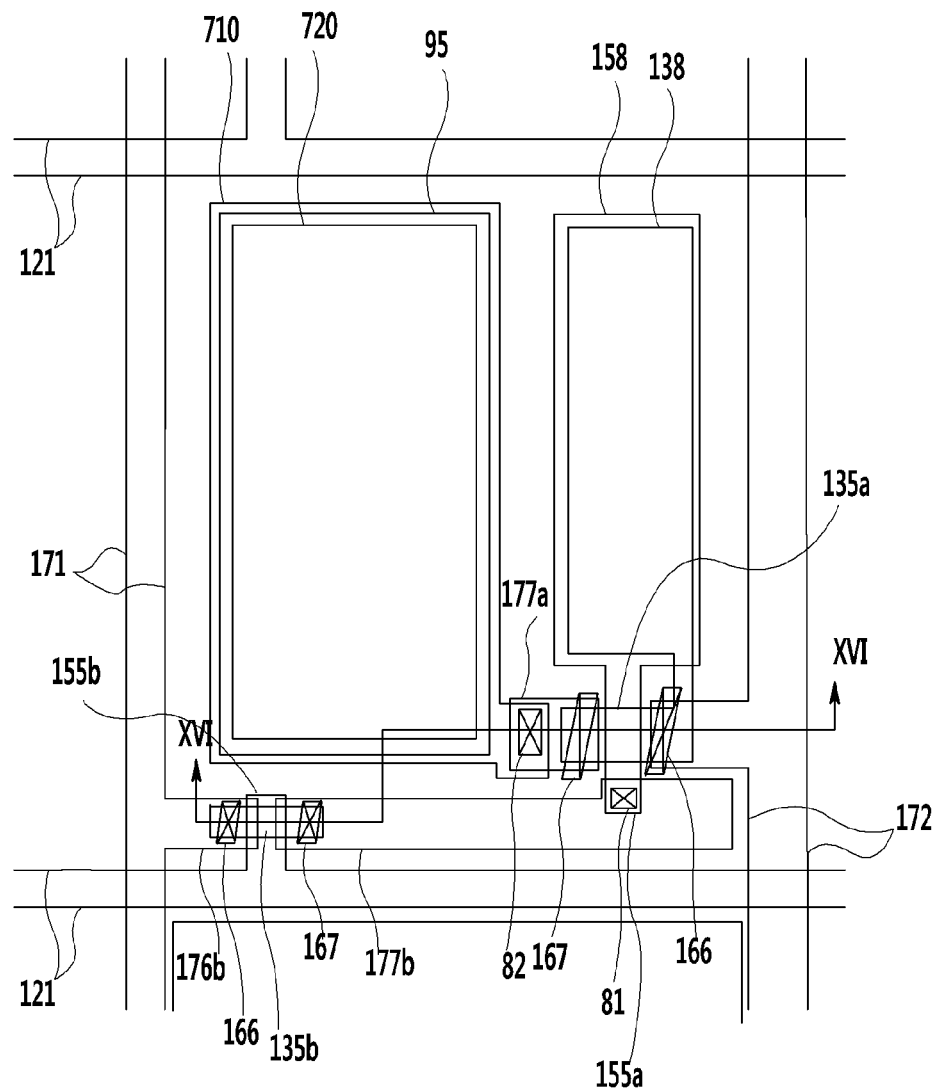
FIG. 16 is a plan view of an exemplary embodiment of an OLED display according to the invention.
Figure 17:
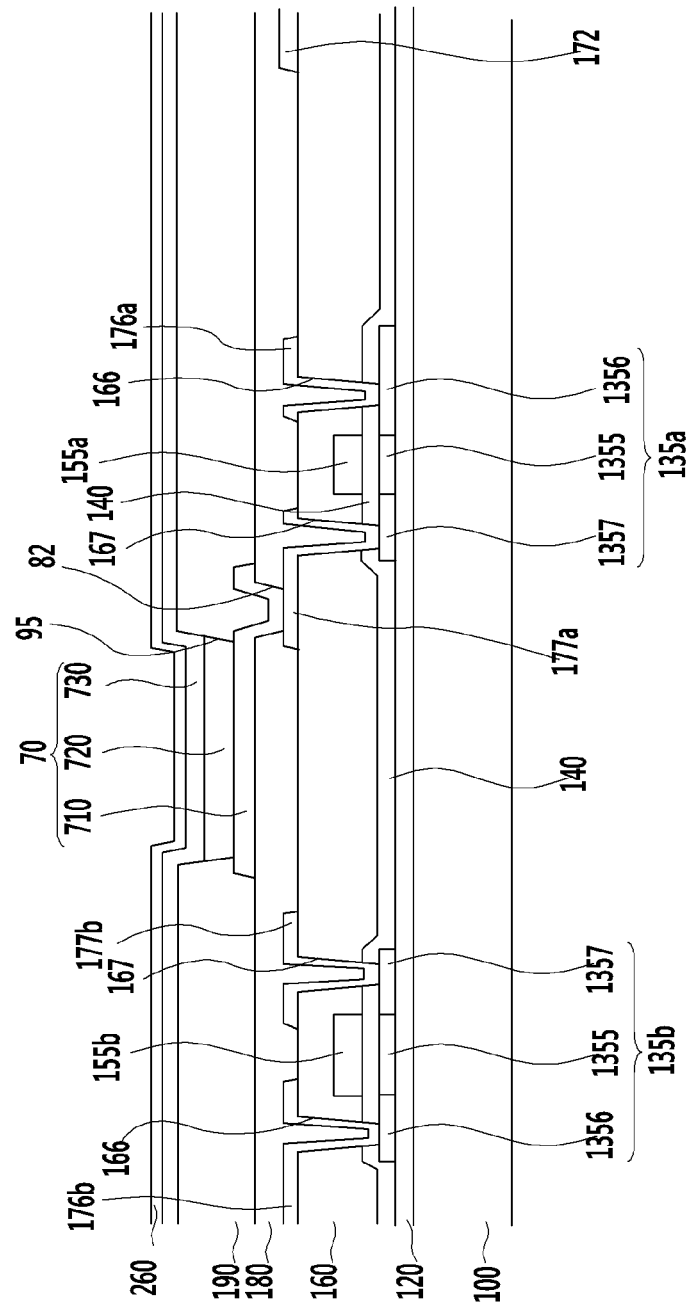
FIG. 17 is a cross-sectional view taken along line XVI-XVI of FIG. 16.

FIG. 16 is a plan view of an OLED display according to an exemplary embodiment, and FIG. 17 is a cross-sectional view taken along line XVI-XVI of FIG. 16.

As shown in FIGS. 16 and 17, a buffer layer 120 is disposed on a substrate 100.

The substrate 100 may be an insulating material including glass, quartz, ceramic, or plastic, or the substrate 100 may be a metallic substrate including stainless steel.

The buffer layer 120 may have a single-layered structure of silicon nitride ($SiN_x$), or a double-layered structure of silicon nitride ($SiN_x$) and silicon oxide ($SiO_2$). The buffer layer 120 prevents unwanted components like impure elements or moisture from intruding into the target, while flattening the surface thereof at the same time.

A first semiconductor 135a, a second semiconductor 135b, and a first capacitor electrode 138 that include polysilicon are disposed on the buffer layer 120.

The first semiconductor 135a and the second semiconductor 135b respectively include a channel region 1355 and a source region 1356 and drain region 1357 disposed at respective sides of the channel region 1355. The channel region 1355 of the semiconductors 135a and 135b includes polysilicon that is not doped with an impurity, that is, an intrinsic semiconductor. The source region 1356 and the drain region 1357 of the semiconductors 135a and 135b include polysilicon that is doped with the conductive impurity, that is, an impurity semiconductor.

The first capacitor electrode 138 is doped with the same conductive impurity as the source region 1356 and the drain region 1357.

The impurity doped in the source region 1356 and the drain region 1357 and the first capacitor electrode 138 may be one of the p-type impurity and the n-type impurity.

The gate insulating layer 140 is disposed on the first semiconductor 135a, the second semiconductor 135b and the first capacitor electrode 138.

The gate insulating layer 140 may be a single layer or a plurality of layers including at least one of tetraethoxysilane (tetraethyl orthosilicate, "TEOS"), silicon nitride ($SiN_x$) and silicon oxide ($SiO_2$).

A gate line 121, a driving gate electrode 155a and a second capacitor electrode 158 are disposed on the gate insulating layer 140.

The gate line 121 extends in a transverse direction, transmits the gate signal, and includes a switching gate electrode 155b protruding from the gate line 121 to the switching semiconductor 135b. The switching gate electrode 155b and the driving gate electrode 155a respectively overlap the channel region 1355.

The switching gate electrode 155b, the driving gate electrode 155a and the second capacitor electrode 158 may include a single layer of a multiple layer including tungsten, molybdenum, aluminum, or alloys thereof.

The second capacitor electrode 158 is connected to the driving gate electrode 155a and overlaps the first capacitor electrode 138.

The first capacitor electrode 138 and the second capacitor electrode 158 provide the capacitor Cst having the gate insulating layer 140 as a dielectric material.

An interlayer insulating layer 160 is disposed on the gate line 121 and the driving gate electrode 155a. The interlayer insulating layer 160 may include tetraethoxysilane (tetraethyl orthosilicate, "TEOS"), silicon nitride, or silicon oxide, like the gate insulating layer 140.

A source contact hole 166 and a drain contact hole 167 respectively exposing the source region 1356 and the drain region 1357 and a contact hole 81 exposing the driving gate electrode 155*a* are defined in the interlayer insulating layer 160 and the gate insulating layer 140.

As shown in FIG. 16, the source contact hole 166 and the drain contact hole 167 are inclined with respect to the semiconductors 135*a* and 135*b*. In an exemplary embodiment, the contact holes may be defined through a photolithography process or a photo-process using a mask. At this time, the mask to provide the contact hole is moved and aligned in the direction of the data line or the gate line such that the contact holes 166 and 167 may be obliquely defined with respect to the data line 171 or the gate line 121.

Although not shown, the semiconductors 135*a* and 135*b* may be inclined with respect to the data line 171 or the gate line 121, like FIGS. 5A to 8B.

A data line 171 including a switching source electrode 176*b*, a driving voltage line 172 including a driving source electrode 176*a*, a switching drain electrode 177, and a driving drain electrode 177*a* are disposed on the interlayer insulating layer 160.

The data line 171 transmits the data signal and extends in a direction intersecting the gate line 121.

The driving voltage line 172 transmits a predetermined voltage, is separated from the data line 171, and extends in substantially parallel to the data line 171.

The switching source electrode 176*b* is protruded from the data line 171 toward the switching semiconductor 135*b*, and the driving source electrode 176*a* is protruded from the driving voltage line 172 toward the driving semiconductor 135*a*. The switching source electrode 176*b* and the driving source electrode 176*a* are respectively connected to the source region 1356 through the source contact holes 166.

The switching drain electrode 177*b* faces the switching source electrode 176*b*, the driving drain electrode 177*a* faces the driving source electrode 176*a*, and the switching drain electrode 177*b* and the driving drain electrode 177*a* are respectively connected to the drain region 1357 through the drain contact holes 167.

The switching drain electrode 177*b* extends according to the gate line, and is electrically connected to the driving gate electrode 155*a* through the contact hole 81.

A capacitor electrode (not shown) may be further disposed on the interlayer insulating layer 160. The additional capacitor electrode may overlap the first capacitor electrode 138 or the second capacitor electrode 158 to be connected in parallel thereby increasing charging capacitance.

A protective layer 180 is disposed on the data line 171 having the switching source electrode 176*b*, the driving voltage line 172 having the driving source electrode 176*a*, the switching drain electrode 177*b* and the driving drain electrode 177*a*.

The protective layer 180 may include the same material as that of the interlayer insulating layer 160, and a contact hole 82 exposing the driving drain electrode 177*a* may be defined in the protective layer 180.

A first electrode 710 is disposed on the protective layer 180. The first electrode 710 is the anode of FIG. 15.

A pixel definition layer 190 having an opening 95 exposing the first electrode 710 is disposed on the protective layer 180 and the first electrode 710. The pixel defining layer 190 can include an inorganic material of a resin or silica group such as polyacrylate resin and polyimide.

An organic emission layer 720 is disposed on the first electrode 710 in the opening 95, and a second electrode 730 is disposed on the organic emission layer 720. As described above, the first electrode 710, the organic emission layer 720 and the second electrode 730 provide an organic light emitting element 70.

Here, the first electrode 710 is the anode as a hole injection electrode, and the second electrode 730 is the cathode as an electron injection electrode. However, an exemplary embodiment according to the exemplary embodiment is not limited thereto, and the first electrode 710 may be the cathode and the second electrode 730 may be the anode according to the driving method of the OLED display. Holes and electrons from the first electrode 710 and the second electrode 730 are respectively injected into the organic emission layer 720, and, light is emitted when excitons being combinations of the injected holes and electrons fall from an excited state to a ground state.

The organic emission layer 720 includes a low molecular weight organic material or a high molecular weight organic material such as poly3,4-ethylenedioxythiophene ("PEDOT"). Also, the organic emission layer 720 can be provided with multiple layers including an emission layer and at least one of a hole injection layer ("HIL"), a hole transport layer ("HTL"), an electron transport layer ("ETL") and an electron injection layer ("EIL"). When the organic emission layer 720 includes an electron auxiliary layer, the HIL is disposed on the first electrode 710 as the anode, and the HTL, ETL and the EIL are sequentially deposited thereon.

In an exemplary embodiment, the organic emission layer 720 may include a red organic emission layer for emitting red light, a green organic emission layer for emitting green light and a blue organic emission layer for emitting blue light, and the red organic emission layer, the green organic emission layer and the blue organic emission layer are respectively provided in red, green and blue pixels, thereby displaying a color image.

Moreover, the red organic emission layer, green organic emission layer and blue organic emission layer of the organic emission layer 720 may be respectively laminated on the red pixel, green pixel and blue pixel, and a red color filter, a green color filter and a blue color filter may be provided for the respective pixels, thereby displaying a color image. In another exemplary embodiment, a white organic emission layer for emitting white light may be disposed on all of the red, green and blue pixels, and a red color filter, a green color filter and a blue color filter may be provided for the respective pixels, thereby displaying a color image. When a white organic emission layer and the color filters are used to display a color image, there is no need to use a deposition mask for depositing the red, green and blue organic emission layers on the respective pixels, i.e., the red, green and blue pixels.

The white organic emission layer described in the illustrated exemplary embodiment may be provided as one organic emission layer or a plurality of organic emission layers that is laminated to emit white light. In an exemplary embodiment, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light, for example.

The second electrode 730 includes a reflective conductive material such that a rear side light emitting type of OLED display is realized. In an exemplary embodiment, lithium (Li), calcium (Ca), lithium fluoride/calcium (LiF/Ca), lithium fluoride/aluminum (LiF/Al), aluminum (Al), silver (Ag), magnesium (Mg), or gold (Au) can be used for the reflective material.

A sealing member 260 may be disposed on the second electrode 730.

In an exemplary embodiment, the sealing member 260 may be provided by alternately providing at least one organic layer and at least one inorganic layer.

In exemplary embodiment, the organic layer and the inorganic layer may be provided in plural.

The organic layer includes a polymer, and it may be a single layer or a deposition layer including one of polyethylene terephthalate, a polyimide, a polycarbonate, an epoxy, polyethylene and a polyacrylate. Further desirably, the organic layer can be provided with a polyacrylate, and in detail, it includes a polymerized monomer composition including a di-acrylate monomer and tri-acrylate monomer. In an exemplary embodiment, a mono-acrylate monomer can be included in the monomer composition. In an exemplary embodiment, a photoinitiator such as TPO can be further included in the monomer composition, but is not limited thereto.

The inorganic layer can be a single layer or a deposition layer including a metal oxide or a metal nitride. In an exemplary embodiment, the inorganic layer can include one of $SiN_x$, $Al_2O_3$, $SiO_2$ and $TiO_2$.

In the sealing member 260, the uppermost layer exposed to the outside may include the inorganic layer in order to prevent the organic light emitting element from being moist.

The sealing member 260 may include at least one sandwich structure in which at least one organic layer is inserted between at least two inorganic layers. In addition, the sealing member may include at least one sandwich structure in which at least one inorganic layer is inserted between at least two organic layers.

The sealing member 260 can sequentially include a first inorganic layer, a first organic layer and a second inorganic layer in an order from the top of the display part. In addition, the sealing member 260 can sequentially include a first inorganic layer, a first organic layer, a second inorganic layer, a second organic layer and a third inorganic layer in order from the top of the display part. Further, the sealing member 260 can sequentially include a first inorganic layer, a first organic layer, a second inorganic layer, a second organic layer, a third inorganic layer, a third organic layer and a fourth inorganic layer in order from the top of the display part.

In an exemplary embodiment, a metal halide layer including LiF can be included between the display part and the first inorganic layer. The metal halide layer prevents the display part from being damaged when the first inorganic layer is provided according to a sputtering method or a plasma deposition method.

The first organic layer may have an area narrower than the second inorganic layer, and the second organic layer may also have the area narrower than the third inorganic layer. Further, the first organic layer is entirely covered by the second inorganic layer, and the second organic layer can be entirely covered by the third inorganic layer.

Figure 18:
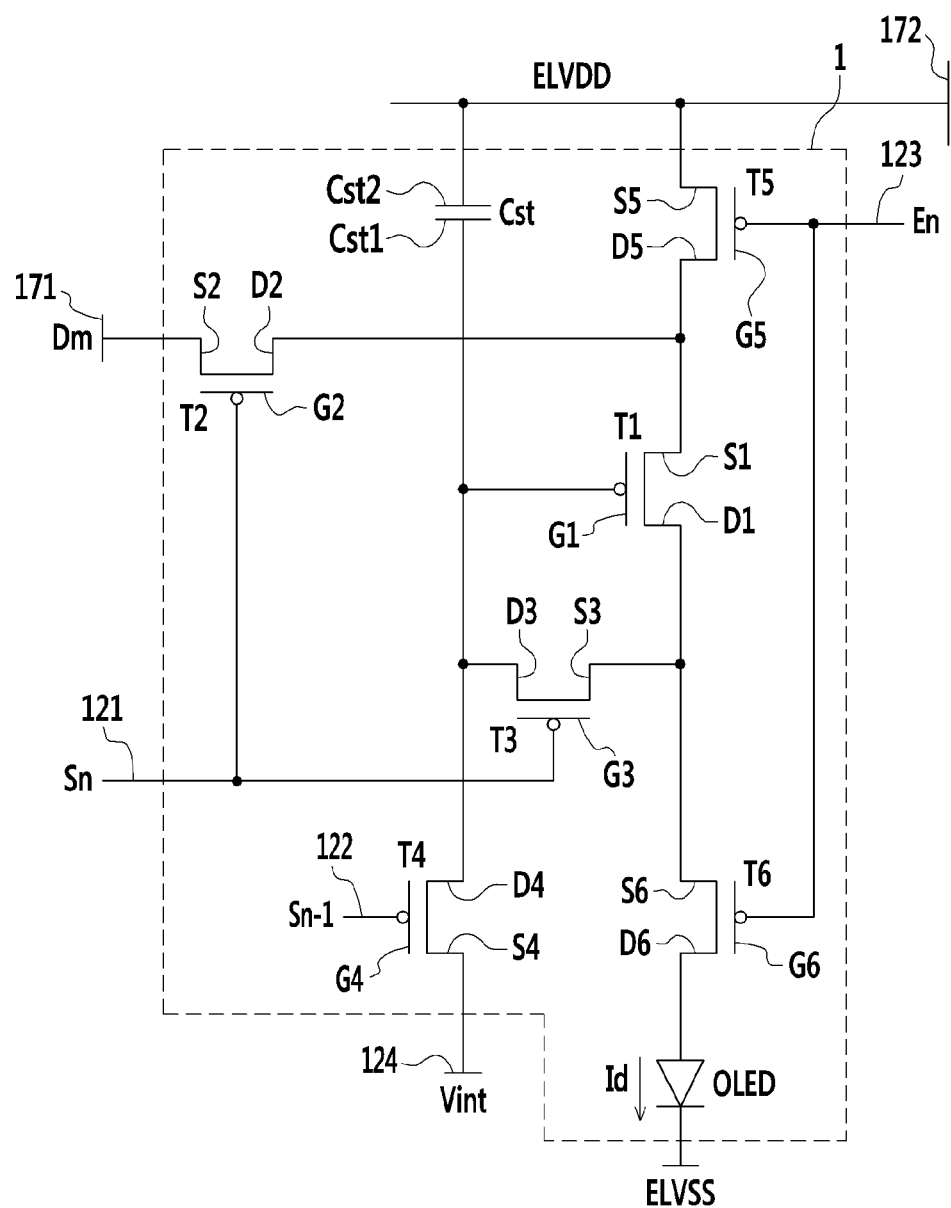
FIG. 18 shows the exemplary embodiment of an equivalent circuit of one pixel of an OLED display according to the invention.

FIG. 18 is an equivalent circuit of one pixel 1 of an OLED display according to another exemplary embodiment.

As shown in FIG. 18, one pixel area of an OLED display according to an exemplary embodiment includes a plurality of signal lines 121, 122, 123, 124, 171 and 172, a plurality of thin film transistors T1, T2, T3, T4, T5 and T6 connected to the plurality of signal lines, a storage capacitor Cst and an organic light emitting element OLED.

The transistor includes a driving thin film transistor, a switching thin film transistor, a compensation transistor, an initialization transistor, an operation control transistor and a light emission control transistor.

For better understanding and ease of description, the driving transistor is referred to as the first transistor T1, the switching transistor is referred to as the second transistor T2, the compensation transistor is referred to as the third transistor T3, the initialization transistor is referred to as the fourth transistor T4, the operation control transistor is referred to as the fifth transistor T5, and the light emission control transistor is referred to as the sixth transistor T6.

The signal lines include a gate line 121 transferring a scan signal Sn, a prior gate line 122 transferring a prior scan signal Sn-1 to the fourth transistor T4, a light emission control line 123 transferring a light emission control signal En to the fifth transistor T5 and the sixth transistor T6, a data line 171 crossing the gate line 121 and transferring a data signal Dm, a driving voltage line 172 transferring a driving voltage ELVDD and provided substantially parallel to the data line 171 and an initialization voltage line 124 transferring an initialization voltage Vint initializing the first transistor T1.

A first gate electrode G1 of the first transistor T1 is connected to an end Cst1 of the storage capacitor Cst, a first source electrode S1 of the first transistor T1 is connected to the driving voltage line 172 via the fifth transistor T5, and a drain electrode D1 of the first transistor T1 is electrically connected to an anode of the organic light emitting element OLED via the sixth transistor T6. The first transistor T1 receives the data signal Dm according to switching operation of the second transistor T2 to supply a driving current Id to the organic light emitting element OLED.

The second gate electrode G2 of the second transistor T2 is connected to the gate line 121, the second source electrode S2 is connected to the data line 171, and the second drain electrode D2 is connected to the first source electrode S1 of the first transistor T1 and to the driving voltage line 172 via the fifth transistor T5. The second transistor T2 is turned on according to the scan signal Sn transferred through the gate line 121 to perform a switching operation of transferring the data signal Dm transferred to the data line 171 to the source electrode of the first transistor T1.

The third gate electrode G3 of the third transistor T3 is connected to the gate line 121, and the third source electrode S3 is connected to the first drain electrode D1 of the first transistor T1 and to the anode of the organic light emitting element 70 via the sixth transistor T6. The third drain electrode D3 is connected to one end Cst1 of the storage capacitor Cst, the fourth drain electrode D4 of the fourth transistor T4 and the first gate electrode G1 of the first transistor T1 together. The third transistor T3 is turned on according to the scan signal Sn transmitted through the gate line 121 to connect the gate electrode G1 and the drain electrode D1 of the first transistor T1 to each other, thus performing diode-connection of the first transistor T1.

The fourth gate electrode G4 of the fourth transistor T4 is connected to the prior gate line 122, the fourth source electrode S4 is connected to the initialization voltage line 124, and the fourth drain electrode D4 is connected to one end Cst1 of the storage capacitor Cst, the third drain electrode D3 of the third transistor T3 and the first gate electrode G1 of the first transistor T1 together. The fourth transistor T4 is turned on according to the prior scan signal Sn-1 transferred through the prior scan line 122 to transfer the initialization voltage Vint to the gate electrode G1 of the first transistor T1, thus performing an initialization operation for initializing the voltage of the gate electrode G1 of the first transistor T1.

The fifth gate electrode G5 of the fifth transistor T5 is connected to the light emission control line 123, the fifth source electrode S5 of the fifth transistor T5 is connected to the driving voltage line 172, and the fifth drain electrode D5 of the fifth transistor T5 is connected to the first source electrode S1 of the first transistor T1 and the second drain electrode D2 of the second transistor T2.

The sixth gate electrode G6 of the sixth transistor T6 is connected to the light emission control line 123, the sixth source electrode S6 of the sixth transistor T6 is connected to the first drain electrode D1 of the first transistor T1 and the third source electrode S3 of the third transistor T3, and the sixth drain electrode D6 of the sixth transistor T6 is electrically connected to the anode of the organic light emitting element OLED. The fifth transistor T5 and the sixth transistor T6 are simultaneously turned on according to the light emission control signal En transferred through the light emission control line 123 to transfer the driving voltage ELVDD to the OLED, thus allowing the driving current Id to flow in the organic light emitting element OLED.

The other end Cst2 of the storage capacitor Cst is connected to the driving voltage line 172, and the cathode of the organic light emitting element OLED is connected to the common voltage ELVSS. Accordingly, the organic light emitting element OLED receives the driving current Id from the driving transistor T1 to emit light, thereby displaying an image.

In this pixel circuit, the first transistor T1 charges the voltage corresponding to the data signal Dm to the storage capacitor Cst according to the scan signal Sn, and the current corresponding to the voltage charged to the storage capacitor Cst is provided to the organic light emitting element OLED. In this case, since a threshold voltage of the first transistor T1 may vary as time passes, the third transistor T3 diode-connects the first transistor T1 in response to the scan signal Sn so that the threshold voltage Vth is compensated.

Now, the operation of the pixel circuit of OLED display according to an exemplary embodiment will be described.

First, the prior scan signal Sn-1 of a low level is supplied through the prior gate line 122 during an initialization period. Then, the fourth transistor T4 is turned on corresponding to the prior scan signal Sn-1 of the low level, and the initialization voltage Vint is connected from the initialization voltage line 124 through the fourth transistor T4 to the first gate electrode G1 of the first transistor T1 to initialize the first transistor T1 by the initialization voltage Vint.

Subsequently, the scan signal Sn of the low level is supplied through the gate line 121 during a data programming period. Then, the second transistor T2 and the third transistor T3 are turned on corresponding to the scan signal Sn of the low level.

In this case, the first transistor T1 is diode-connected by the turned-on third transistor T3, and is biased in a forward direction.

Then, a compensation voltage Dm+Vth (where Vth is a negative value) obtained by subtracting a threshold voltage Vth of the first transistor T1 from the data signal Dm supplied from the data line 171 is applied to the gate electrode of the first transistor T1.

The driving voltage ELVDD and the compensation voltage Dm+Vth are respectively applied to both ends of the storage capacitor Cst, and a charge corresponding to a difference between voltages at both ends of the storage capacitor Cst is stored in the storage capacitor Cst. Thereafter, a level of the light emission control signal En supplied from the light emission control line 123 during the light emission period is changed from a high level to the low level. Then, the fifth transistor T5 and the sixth transistor T6 are turned on by the light emission control signal En of the low level during the light emission period.

Subsequently, the driving current Id is generated according to a difference between the voltage of the first gate electrode of the first transistor T1 and the driving voltage ELVDD, and the driving current Id is supplied through the sixth transistor T6 to the organic light emitting element OLED. A gate-source voltage Vgs of the first transistor T1 is maintained at "(Dm+Vth)-ELVDD" by the storage capacitor Cst during the light emission period, and the driving current Id is proportional to a square of a value obtained by subtracting the threshold voltage Vth from a gate-source voltage Vgs, that is, "$(Dm-ELVDD)^2$", according to a current-voltage relationship of the first transistor T1. Accordingly, the driving current Id is determined regardless of the threshold voltage Vth of the first transistor T1.

Next, the detailed structure of the pixel 1 of the OLED display shown in FIG. 18 will be described with reference to FIGS. 19 to 21.

Figure 19:
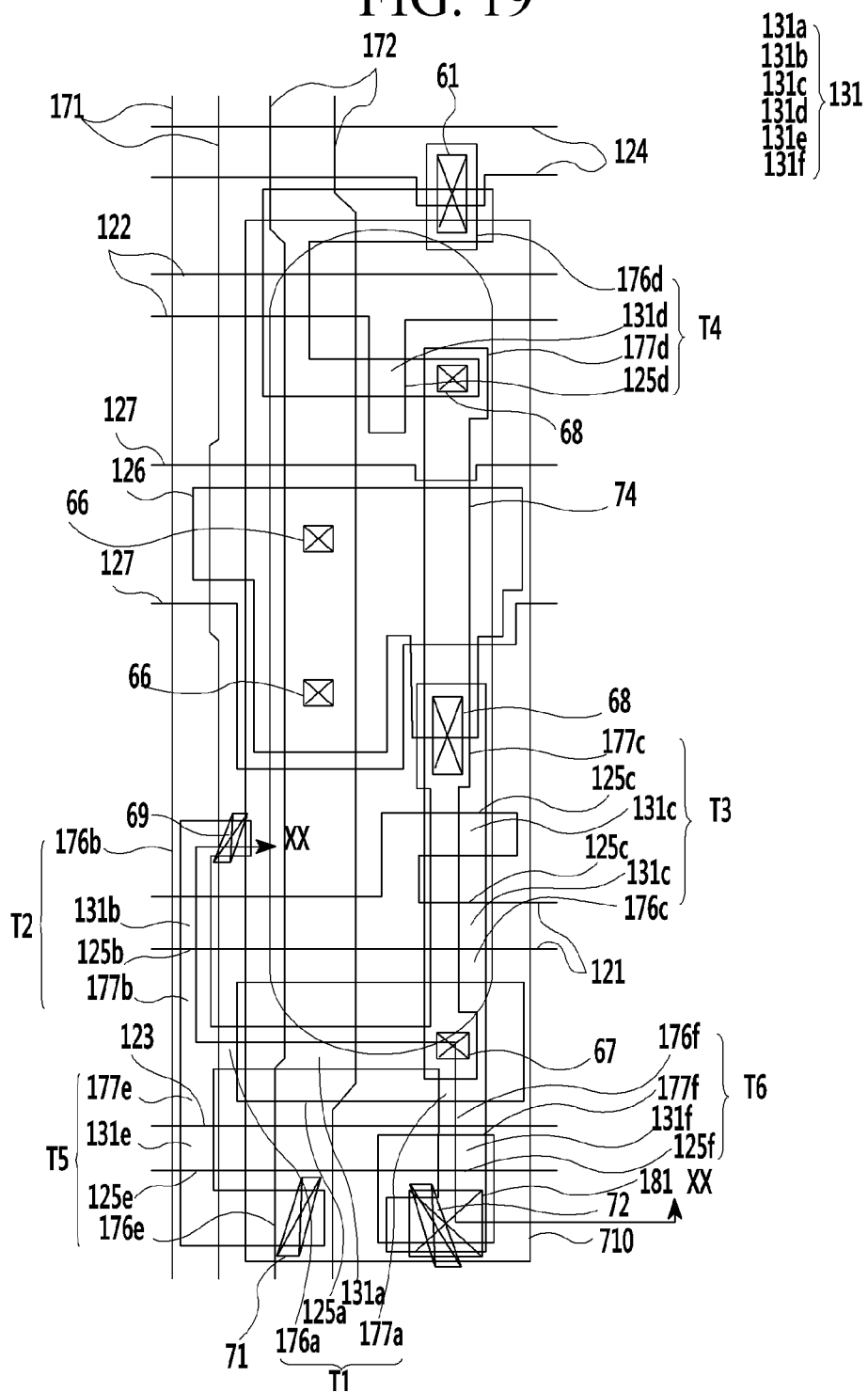
FIG. 19 is a plan view of an exemplary embodiment of an OLED display according to the invention.
Figure 20:
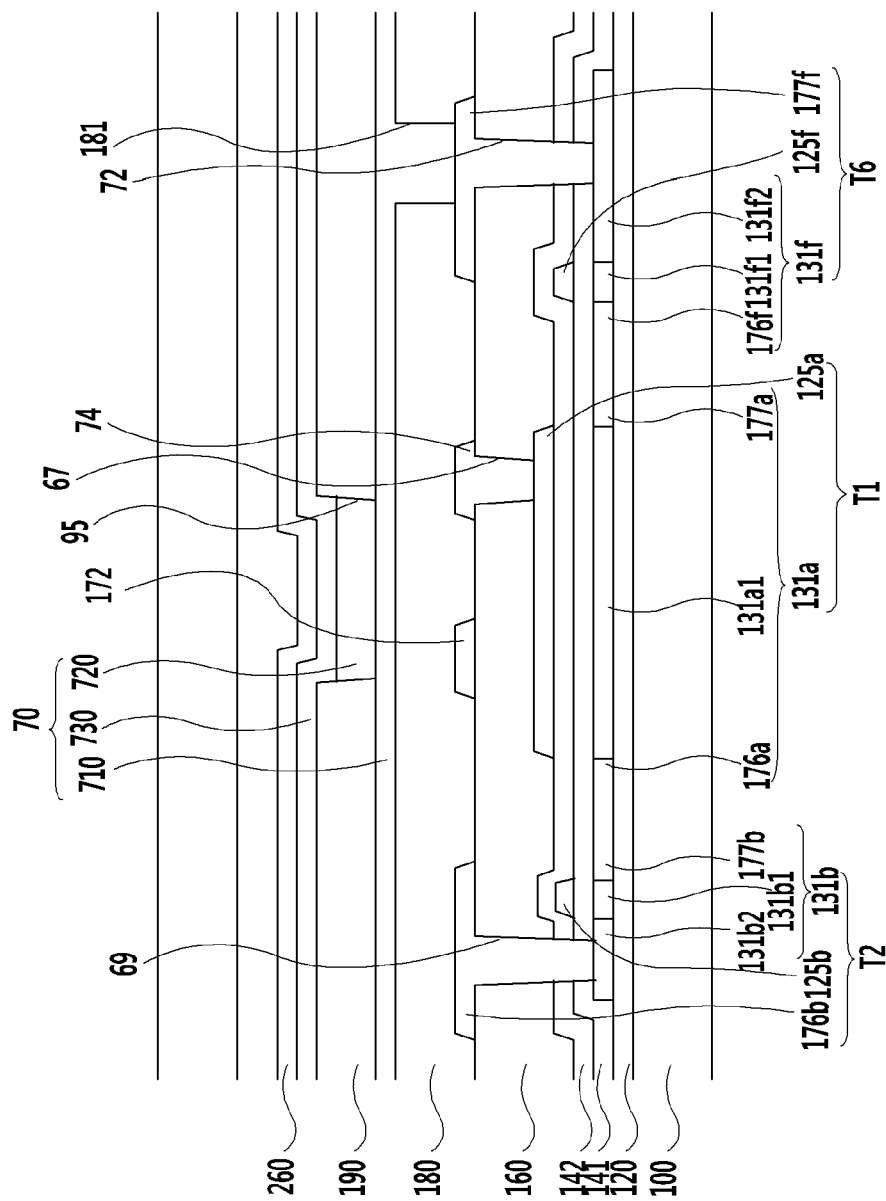
FIG. 20 is a cross-sectional view of the OLED display of FIG. 19 taken along line XX-XX.

FIG. 19 is a plan view of an OLED display according to an exemplary embodiment, and FIG. 20 is a cross-sectional view of the OLED display of FIG. 19 taken along line XX-XX.

As shown in FIG. 19, an OLED display according to an exemplary embodiment includes the gate line 121, the prior gate line 122, the light emission control line 123 and the initialization voltage line 124 respectively applying the scan signal Sn, the prior scan signal Sn-1, the light emission control signal En and the initialization voltage Vint, and provided in the row direction. The OLED display according to the exemplary embodiment further includes the data line 171 and the driving voltage line 172 intersecting the gate line 121, the prior gate line 122, and the light emission control line 123 and the initialization voltage line 124 respectively applying the data signal Dm and the driving voltage ELVDD to the pixel.

Also, the first transistor T1, the second transistor T2, the third transistor T3, the fourth transistor T4, the fifth transistor T5, the sixth transistor T6, the storage capacitor Cst and the organic light emitting element 70 are provided in the pixel.

The first transistor T1, the second transistor T2, the third transistor T3, the fourth transistor T4, the fifth transistor T5 and the sixth transistor T6 are provided according to the semiconductor 131, and the semiconductor 131 is provided to be bent in various shapes.

The semiconductor 131 includes a first semiconductor 131a of the first transistor T1, a second semiconductor 131b of the second transistor T2, a third semiconductor 131c of the third transistor T3, a fourth semiconductor 131d of the fourth transistor T4, a fifth semiconductor 131e of the fifth transistor T5 and a sixth semiconductor 131f of the sixth transistor T6.

The semiconductor 131 may include polysilicon, microcrystalline silicon, or an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide ("ZnO"), indium-gallium-zinc oxide ($InGaZnO_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O) or any combinations thereof. In the case where the semiconductor 131 includes the oxide semiconductor, a separate protective layer may be added to protect the oxide semiconductor that is weak with regard to an external environment such as high temperatures, for example.

The semiconductors 131a to 131f of each transistor include a channel region and a source region and drain region disposed at respective sides of the channel region and doped with a conductive impurity at a high concentration.

The transistors T1 to T6 respectively include a first gate electrode 125a, a second gate electrode 125b, a third gate electrode 125c, a fourth gate electrode 125d, a fifth gate electrode 125e and a sixth gate electrode 125f respectively overlapping the channel region of the semiconductors 131a to 131f.

The first gate electrode 125a may be provided with the same material as that of the prior gate line 122, the fourth gate electrode 125d and a second capacitor electrode 127, and the first gate electrode 125a, the prior gate line 122, the fourth gate electrode 125d and a second capacitor electrode 127 may be disposed in and/or on the same layer.

The transistors T1 to T6 respectively include the first source electrode 176a, the second source electrode 176b, a third source electrode 176c, a fourth source electrode 176d, a fifth source electrode 176e and a sixth source electrode 176f respectively connected to the source region of the semiconductors 131a to 131f, and the first drain electrode 177a, the second drain electrode 177b, a third drain electrode 177c, a fourth drain electrode 177d, a fifth drain electrode 177e and a sixth drain electrode 177f respectively connected to the drain region of the semiconductors 131a to 131f.

In an exemplary embodiment, the first to sixth source electrodes 176a to 176f and the first to sixth drain electrodes 177a to 177f may be provided with a metal separated from the semiconductor and may be connected to the source region and the drain region, but the invention is not limited thereto, and the source region and the drain region may be the source electrode and the drain electrode without the separated metal.

The first transistor T1 includes the first semiconductor 131a, the first gate electrode 125a, the first source electrode 176a, and the first drain electrode 177a. The first source electrode 176a corresponds to the source region in the first semiconductor 131a, and the first drain electrode 177a corresponds to the first drain region in the first semiconductor 131a.

The second transistor T2 includes the second semiconductor 131b, the second gate electrode 125b, the second source electrode 176b and the second drain electrode 177b. The second source electrode 176b is protruded from the data line 171, and the second drain electrode 177b corresponds to the drain region in the second semiconductor 131b.

The third transistor T3 includes the third semiconductor 131c, the third gate electrode 125c, the third source electrode 176c and the third drain electrode 177c, and the third source electrode 176c corresponds to the source region in the third semiconductor 131c, while the third drain electrode 177c is connected to a connection member 74.

The fourth transistor T4 includes the fourth semiconductor 131d, the fourth gate electrode 125d, the fourth source electrode 176d and the fourth drain electrode 177d. The fourth source electrode 176d is connected to the source region of the fourth semiconductor 131d, and the fourth drain electrode 177d is connected to the drain region of the fourth semiconductor 131d.

The fourth source electrode 176d is simultaneously connected to the initialization voltage line 124 and the drain region of the fourth semiconductor 131d through a contact hole 61 defined in the first gate insulating layer, the second gate insulating layer and the interlayer insulating layer and simultaneously exposing the initialization voltage line 124 and the fourth semiconductor 131d. The fourth drain electrode 177d is connected to the connection member 74 and is connected to the fourth semiconductor 131d through a contact hole 63 defined in the first gate insulating layer, the second gate insulating layer and the interlayer insulating layer.

The fifth transistor T5 includes the fifth semiconductor 131e, the fifth gate electrode 125e, the fifth source electrode 176e and the fifth drain electrode 177e. The fifth source electrode 176e as a portion of the driving voltage line 172 is connected to the source region of the fifth semiconductor 131e through a contact hole 71 defined in the first gate insulating layer, the second gate insulating layer and the interlayer insulating layer, and the fifth drain electrode 177e corresponds to the drain region of the fifth semiconductor 131e.

The sixth transistor T6 includes the sixth semiconductor 131f, the sixth gate electrode 125f, the sixth source electrode 176f and the sixth drain electrode 177f. The sixth source electrode 176f corresponds to the source region in the sixth semiconductor 131f, and the sixth drain electrode 177f is connected to the drain region of the sixth semiconductor 131f through a contact hole 72 defined in the first gate insulating layer, the second gate insulating layer and the interlayer insulating layer.

One end of the first semiconductor 131a is connected to the second semiconductor 131b and the fifth semiconductor 131e and shares the source region or the drain region as the high concentration doping region. Also, the other end of the first semiconductor 131a is connected to the third semiconductor 131c and the sixth semiconductor 131f and shares the source region and the drain region as the high concentration doping region.

Accordingly, the first source electrode 176a is connected to the second drain electrode 177b and the fifth drain electrode 177e, and the first drain electrode 177a is connected to the third source electrode 176c and the sixth source electrode 176f.

Also, a contact hole 69 exposing the second source region 176b, the contact hole 71 exposing the fifth source region 176e and the contact hole 72 exposing the sixth drain region 177f are inclined with respect to the semiconductors 131a, 131e and 131f, as shown in FIG. 19. In an exemplary embodiment, contact holes 69, 71 and 72 may be defined by a photolithography process or a photo-process using a mask. At this time, the mask to provide the contact hole is moved and aligned in the direction of the data line or the gate line such that the contact holes 69, 71 and 72 are inclined with respect to the data line 171 or the gate line 121.

Although not shown, the semiconductors 131a, 131e and 131f may be inclined with respect to the data line 171 or the gate line 121, like the embodiments shown in FIGS. 5A to 8B.

The storage capacitor Cst includes the first capacitor electrode 126 and the second capacitor electrode 127 disposed via at least one among the first gate insulating layer and the second gate insulating layer. Here, the first gate insulating layer and the second gate insulating layer become the dielectric material, and storage capacitance of the storage capacitor is determined by the charge charged to the storage capacitor Cst and the voltage between both capacitor electrodes 126 and 127.

The first capacitor electrode 126 includes the same material as that of the gate line 121, the second gate electrode 125b, the third gate electrode 125c, the light emission control line 123, the initialization voltage line 124, the fifth gate electrode 125e and the sixth gate electrode 125f, and the first capacitor electrode 126, the gate line 121, the second gate electrode 125b, the third gate electrode 125c, the light emission control line 123, the initialization voltage line 124, the fifth gate electrode 125e and the sixth gate electrode 125f are disposed in and/or on the same layer. The second capacitor electrode 127 includes the same material as that of the prior gate line 122, the first gate electrode 125a and the fourth gate electrode 125d, the second capacitor electrode 127 the prior gate line 122, the first gate electrode 125a and the fourth gate electrode 125d are disposed in and/or on the same layer. The first capacitor electrode 126 and the second capacitor electrode 127 may include a gate wire including one or more metals of aluminum (Al), chromium (Cr), molybdenum (Mo), titanium (Ti), tantalum (Ta), an Al—Ni—La alloy, an Al—Nd alloy or any combinations thereof. Therefore, the storage capacitance may be improved as compared to a structure where any one capacitive plate of the storage capacitor Cst includes the semiconductor layer.

For the storage capacitor, the second capacitor electrode, the data line 171 and the driving voltage line 172 may be disposed in and/or on the same layer, and the first capacitor electrode, the gate line 121 and the prior gate line 122 may be disposed in and/or on the same layer.

The driving voltage line 172 overlapping and passing the storage capacitor Cst intersects the initialization voltage line 124, the prior gate line 122 and the fourth transistor T4. A portion of the driving voltage line 172 corresponds to the fifth source electrode 176e and is connected to the source region of the fifth semiconductor T5 through the contact hole 71, and the other portion of the driving voltage line 172 is connected to the second capacitor electrode 127 through a contact hole 66 defined in the interlayer insulating layer.

The connection member 74 is provided parallel to the driving voltage line 172 and the connection member 74 and the driving voltage line 172 are disposed in and/or on the same layer. One end of the connection member 74 is connected to the first gate electrode 125a through a contact hole 67 defined in the interlayer insulating layer, and the other end is connected to the fourth drain electrode 177d. A portion of the connection member 74 is connected to the drain region of the third semiconductor 131c and the first capacitor electrode 126 through a contact hole 68 together exposing the third drain electrode 177c and the first capacitor electrode 126.

Accordingly, the storage capacitor Cst stores the capacitance corresponding to the difference between the driving voltage ELVDD transmitted through the driving voltage line 172 and the gate voltage of the first gate electrode 125a.

The second transistor T2 is used as a switch selecting a pixel to be emitted. The second gate electrode 125b is connected to the gate line 121, the second source electrode 176b is connected to the data line 171 through the contact hole 69 defined in the first gate insulating layer, the second gate insulating layer and the interlayer insulating layer, and the second drain electrode 177b is connected to the first transistor T1 and the fifth transistor T5. Also, the sixth drain electrode 177f of the sixth transistor T6 is directly connected to the first electrode 710 of the organic light emitting element 70 through a contact hole 181 defined in the protective layer.

Next, the structure of the OLED display according to an exemplary embodiment will be described with reference to FIG. 20 according to a deposition order.

At this time, the first transistor T1, the second transistor T2 and the sixth transistor T6 will be mainly described for the structure of the transistor. Also, the third transistor T3 and the fourth transistor T4 are the same as most of the deposition structure of the first transistor T1 and the second transistor T2, and the fifth transistor T5 is the same as most of the deposition structure of the sixth transistor T6, such that they are not described in further detail.

Referring to FIG. 20, a buffer layer 120 is disposed on a substrate 100 of an OLED display according to an exemplary embodiment.

The substrate 100 may be a transparent insulating substrate including glass, quartz, ceramic, a polymer material, or the like, or the substrate 100 may be a metallic substrate including stainless steel or the like. In an exemplary embodiment, the polymer material may be an organic material including at least one of polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyallylate, polyimide, polycarbonate ("PC"), cellulose triacetate ("TAC") and cellulose acetate propionate ("CAP") as an insulating organic material.

The buffer layer 120 may have a single-layered structure of silicon nitride ($SiN_x$), or a double-layered structure of silicon nitride ($SiN_x$) and silicon oxide ($SiO_2$). The buffer layer 120 prevents unwanted components like impure elements or moisture from intruding into the target, while flattening the surface thereof at the same time.

A first semiconductor 131a, a second semiconductor 131b and a sixth semiconductor 131f that include polysilicon are disposed on the buffer layer 120.

The first semiconductor 131a includes the source region and the drain region disposed at respective sides of a channel region 131a1, and the source region and the drain region respectively become the first source electrode 176a and the first drain electrode 177a. Also, the second semiconductor 131b includes the source region and the drain region disposed at respective sides of a channel region 131b1, the drain region becomes the second drain electrode 177b, and a source region 131b2 is connected to the second source electrode 176b. The sixth semiconductor 131f includes the source region and the drain region disposed at respective sides of a channel region 131f1, the source region becomes the sixth source electrode 176f, and a drain region 131f2 is connected to the sixth drain electrode 177f.

A first gate insulating layer 141 includes silicon nitride ($SiN_x$) or silicon oxide ($SiO_2$) on the first semiconductor 131a, the second semiconductor 131b and the sixth semiconductor 131f.

The first gate wires 121, 123, 125e, 125f, 124 and 126 including a gate line 121 including the second gate electrode 125b and the third gate electrode 125c, a light emission control line 123 including the fifth gate electrode 125e and the sixth gate electrode 125f, the initialization voltage line 124 and the first capacitor electrode 126 are disposed on the first gate insulating layer 141.

A second gate insulating layer 142 is disposed on the first gate wires 123, 125e, 125f, 124 and 126 and the first gate insulating layer 141. In an exemplary embodiment, the second gate insulating layer 142 includes silicon nitride (SiN$_x$) or silicon oxide (SiO$_2$).

The second gate wires 125a, 122 and 127 including the first gate electrode 125a, the prior gate line 122 and the second capacitor electrode 127 are disposed on the second gate insulating layer 142.

Also, the gate line 121 including the second gate electrode 125b and the third gate electrode 125c may be disposed on the second gate insulating layer 142, not the first gate insulating layer 141.

As described above, the first gate insulating layer 141 and the second gate insulating layer 142 are disposed between the first semiconductor 131a and the first gate electrode 125a such that the interval between the first semiconductor 131a and the first gate electrode 125a is widened. Accordingly, a driving range of the gate voltage applied to the first gate electrode 125a to express all grayscales is widened.

The interlayer insulating layer 160 is disposed on the second gate wires 125a, 125b, 125c, 121, 122 and 127 and the second gate insulating layer 142. The interlayer insulating layer 160 includes a ceramic-based material such as silicon nitride (SiN$_x$) or silicon oxide (SiO$_2$), like the first gate insulating layer 141 and the second gate insulating layer 142.

The data wires including the data line 171 including the second source electrode 176b, the fourth drain electrode 177d and the third drain electrode 177c, the connection member 74 connected thereto, the sixth drain electrode 177f and the driving voltage line 172 including the fifth source electrode 176e are disposed on the interlayer insulating layer 160.

Also, the second source electrode 176b and the sixth drain electrode 177f are respectively connected to the source region 131b2 of the second semiconductor 131b through the contact holes 69 and 72 defined in the first gate insulating layer 141, the second gate insulating layer 142 and the interlayer insulating layer 160. Also, the connection member 74 and the driving voltage line 172 are connected to the first gate electrode 125a and the second capacitor electrode 127 through the contact holes 67 and 66 defined in the interlayer insulating layer 160.

The protective layer 180 covering the data wires 171, 172, 74 and 177f is disposed on the interlayer insulating layer 160, and the first electrode 710 is disposed on the protective layer 180. The first electrode 710 is connected to the sixth drain electrode 177f through the contact hole 181 defined in the protective layer 180.

An opening 95 exposing the first electrode 710 is defined in a pixel definition layer 190 disposed on the protective layer 180 and the first electrode 710.

The organic emission layer 720 is disposed on the first electrode 710 in the opening 95, and the second electrode 730 is disposed on the organic emission layer 720. As described above, the first electrode 710, the organic emission layer 720 and the second electrode 730 provide the organic light emitting element 70.

The sealing member 260 is disposed on the second electrode 730.

Figure 21:
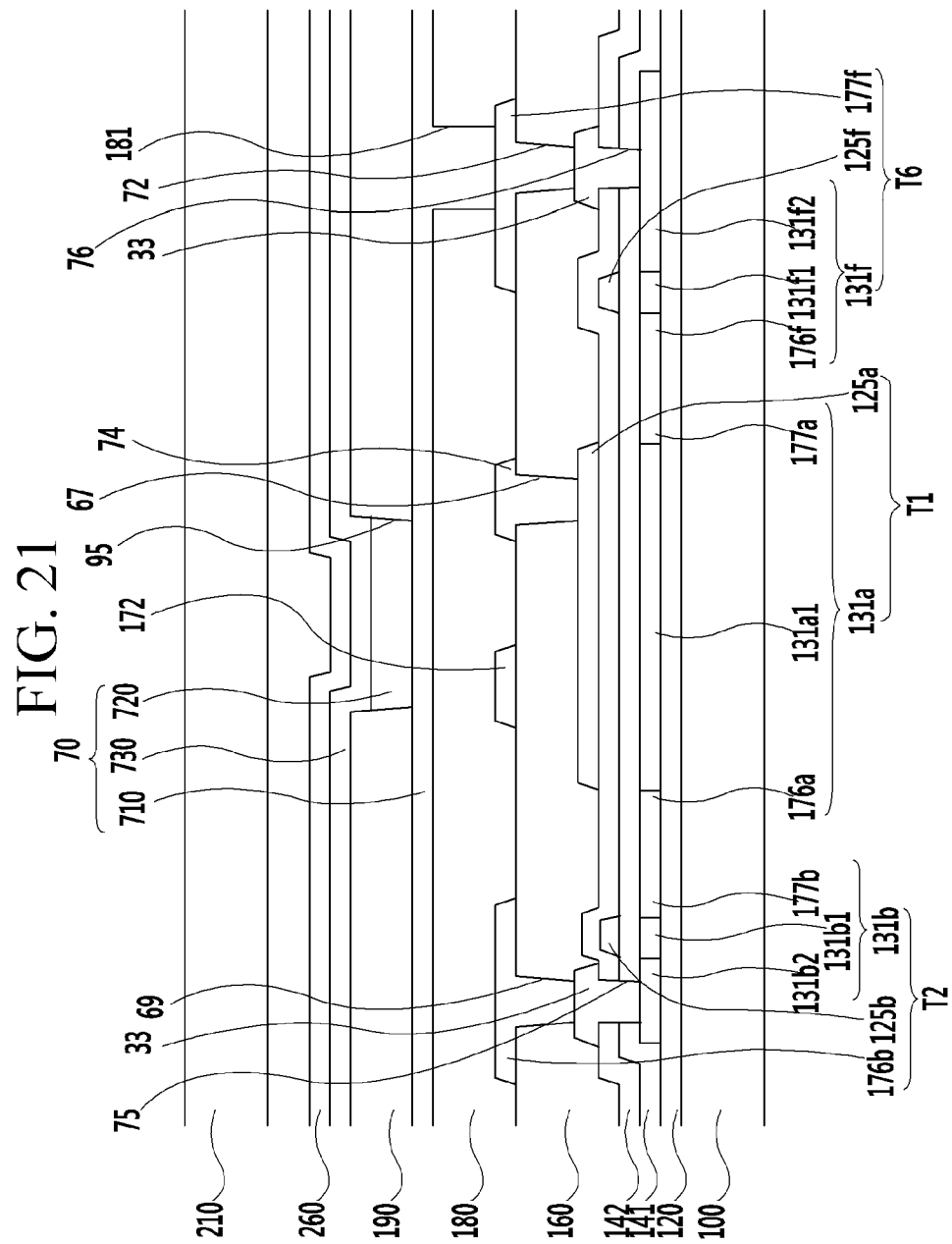
FIG. 21 is a cross-sectional view of another exemplary embodiment of an OLED display taken along line XX-XX of FIG. 19.

FIG. 21 is a cross-sectional view of an OLED display according to another exemplary embodiment taken along line XX-XX of FIG. 19.

The layered structure of the OLED display shown in FIG. 21 is the same as most of the OLED display shown in FIG. 20.

The source electrode 176b of the second transistor T2 of the OLED display of FIG. 21 is electrically connected to the source region 131b2, and the drain electrode 177f of the sixth transistor T6 is electrically connected to the drain region 131f2.

Here, the middle metal layer 33 electrically contacting the semiconductors 131b and 131f is disposed on the semiconductors 131b and 131f.

The middle metal layer 33 is connected to the source region 131b2 and the drain region 131f2 through contact holes 75 and 76, and the source electrode 176b and the drain electrode 177f are electrically connected to the middle metal layer 33 through the contact holes 69 and 72.

In an exemplary embodiment, the middle metal layer 33 may include the same material as that of the first gate electrode 125a, and the middle metal layer 33 and the first gate electrode 125a may be disposed in and/or on the same layer. However, in another exemplary embodiment, the middle metal layer 33 may include the same material as that of the sixth gate electrode 125f, and the middle metal layer 33 and the sixth gate electrode 125f may be disposed in and/or on the same layer.

The contact holes 69 and 72 of FIG. 21 obliquely traverse the semiconductors 131b and 131f, like contact holes of FIGS. 1 to 10.

While this disclosure has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
    a substrate;
    a gate line disposed on the substrate and extended in a first direction;
    a data line and a driving voltage line disposed on the substrate and extended in a second direction intersecting the first direction;
    a switching thin film transistor connected to the gate line and the data line, and including a first semiconductor;
    a driving thin film transistor connected to a drain electrode of the switching thin film transistor, and including a second semiconductor, and the first semiconductor and the second semiconductor respectively include a source region, a drain region and a channel region;
    an insulating layer disposed on the first semiconductor and second semiconductor, and contact holes defined in the insulating layer, the contact holes respectively exposing the source region and the drain region of the first semiconductor and the second semiconductor; and
    an organic light emitting diode connected to the driving thin film transistor,
    wherein at least one of the contact holes is inclined with respect to the first direction and the second direction.
2. The organic light emitting diode display of claim 1, wherein:

the data line is connected to a source electrode of the switching thin film transistor, and the source electrode is respectively connected to the source region through one of the contact holes.

3. The organic light emitting diode display of claim 2, wherein the insulating layer includes a first gate insulating layer disposed on the first semiconductor and the second semiconductor, and a second gate insulating layer disposed on the first gate insulating layer, and a gate electrode of the driving thin film transistor is disposed on the second gate insulating layer.

4. The organic light emitting diode display of claim 3, wherein:

a gate electrode of the switching thin film transistor is disposed on the first gate insulating layer.

5. The organic light emitting diode display of claim 3, further comprising:

a middle metal layer which is electrically connected to the first semiconductor or the second semiconductor and which traverses the first semiconductor or the second semiconductor.

6. The organic light emitting diode display of claim 5, wherein:

the middle metal layer is disposed in a same layer as the gate electrode of the switching thin film transistor or with the gate electrode of the driving thin film transistor.

* * * * *